United States Patent
Lee et al.

(10) Patent No.: US 9,793,377 B2
(45) Date of Patent: Oct. 17, 2017

(54) THIN FILM TRANSISTOR, THIN FILM TRANSISTOR ARRAY PANEL INCLUDING THE SAME, AND MANUFACTURING METHOD THEREOF

(71) Applicant: Samsung Display Co., Ltd., Yongin (KR)

(72) Inventors: Je Hun Lee, Seoul (KR); Jun Ho Song, Seongnam-si (KR); Yun Jong Yeo, Seoul (KR); Hwa Dong Jung, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/808,769

(22) Filed: Jul. 24, 2015

(65) Prior Publication Data
US 2015/0333154 A1    Nov. 19, 2015

Related U.S. Application Data

(62) Division of application No. 13/683,468, filed on Nov. 21, 2012, now Pat. No. 9,093,540.

(30) Foreign Application Priority Data

Jun. 4, 2012    (KR) .................. 10-2012-0059605

(51) Int. Cl.
*H01L 29/66*    (2006.01)
*H01L 29/786*    (2006.01)
(Continued)

(52) U.S. Cl.
CPC .. *H01L 29/66742* (2013.01); *H01L 21/02205* (2013.01); *H01L 21/2686* (2013.01);
(Continued)

(58) Field of Classification Search
CPC .................. H01L 29/66742; H01L 21/02205
See application file for complete search history.

(56) References Cited

U.S. PATENT DOCUMENTS

| | | |
|---|---|---|
| 4,876,582 A | 10/1989 | Janning |
| 4,979,006 A | 12/1990 | Tanaka et al. |

(Continued)

FOREIGN PATENT DOCUMENTS

| | | |
|---|---|---|
| CN | 1607639 | 4/2005 |
| CN | 101764064 | 6/2010 |

(Continued)

OTHER PUBLICATIONS

Notice of Allowance dated May 26, 2016 in U.S. Appl. No. 14/809,830.

(Continued)

*Primary Examiner* — Marc Armand
(74) *Attorney, Agent, or Firm* — H.C. Park & Associates, PLC

(57) ABSTRACT

The present invention relates to a thin film transistor, a thin film transistor array panel, and a manufacturing method thereof. A thin film transistor according to an exemplary embodiments of the present invention includes: a gate electrode; a gate insulating layer positioned on or under the gate electrode; a channel region overlapping the gate electrode, the gate insulating layer interposed between the channel region and the gate electrode; and a source region and a drain region, facing each other with respect to the channel region, positioned in the same layer as the channel region, and connected to the channel region, wherein the channel region, the source region, and the drain region comprise an oxide semiconductor, and wherein a carrier concentration of the source region and the drain region is larger than a carrier concentration of the channel region.

17 Claims, 25 Drawing Sheets

(51) Int. Cl.
*H01L 29/40* (2006.01)
*H01L 21/28* (2006.01)
*H01L 21/268* (2006.01)
*H01L 21/308* (2006.01)
*H01L 21/02* (2006.01)
*H01L 27/12* (2006.01)
*H01L 29/423* (2006.01)
*H01L 29/08* (2006.01)
*H01L 29/86* (2006.01)

(52) U.S. Cl.
CPC .... *H01L 21/28247* (2013.01); *H01L 21/3086* (2013.01); *H01L 27/1214* (2013.01); *H01L 29/0847* (2013.01); *H01L 29/401* (2013.01); *H01L 29/42356* (2013.01); *H01L 29/66969* (2013.01); *H01L 29/7869* (2013.01); *H01L 29/78693* (2013.01); *H01L 29/86* (2013.01)

(56) References Cited

U.S. PATENT DOCUMENTS

| | | | |
|---|---|---|---|
| 5,017,983 | A | 5/1991 | Wu |
| 5,233,211 | A | 8/1993 | Hayashi et al. |
| 5,367,180 | A | 11/1994 | Asai et al. |
| 5,637,512 | A | 6/1997 | Miyasaka et al. |
| 5,808,595 | A | 9/1998 | Kubota et al. |
| 5,828,084 | A | 10/1998 | Noguchi et al. |
| 6,501,098 | B2 | 12/2002 | Yamazaki |
| 6,542,205 | B2 | 4/2003 | Ohtani et al. |
| 6,882,102 | B2 | 4/2005 | Yamazaki |
| 6,998,283 | B2 | 2/2006 | Kim et al. |
| 7,045,818 | B2 | 5/2006 | Jinno et al. |
| 7,335,917 | B2 | 2/2008 | Koo et al. |
| 7,411,215 | B2 | 8/2008 | Hayakawa et al. |
| 7,414,267 | B2 | 8/2008 | Yamazaki et al. |
| 7,420,214 | B2 | 9/2008 | Adachi |
| 7,557,411 | B2 | 7/2009 | Noguchi et al. |
| 7,821,065 | B2 | 10/2010 | Murakami et al. |
| 8,071,985 | B2 | 12/2011 | Sakurai et al. |
| 8,188,472 | B2 | 5/2012 | Park et al. |
| 8,273,600 | B2 | 9/2012 | Shieh et al. |
| 8,283,671 | B2 | 10/2012 | Kim et al. |
| 8,350,621 | B2 | 1/2013 | Yamazaki et al. |
| 8,389,989 | B2 | 3/2013 | Yamazaki |
| 8,735,883 | B2 | 5/2014 | Kim et al. |
| 2002/0030189 | A1 | 3/2002 | Ishikawa |
| 2005/0074963 | A1 | 4/2005 | Fujii et al. |
| 2005/0148123 | A1 | 7/2005 | Mao-Tsum |
| 2007/0159565 | A1 | 7/2007 | Segawa et al. |
| 2007/0278490 | A1 | 12/2007 | Hirao et al. |
| 2007/0287237 | A1 | 12/2007 | Rockenberger et al. |
| 2008/0102550 | A1 | 5/2008 | Kook et al. |
| 2008/0258141 | A1 | 10/2008 | Park et al. |
| 2009/0065771 | A1 | 3/2009 | Iwasaki et al. |
| 2010/0090208 | A1 | 4/2010 | Moon et al. |
| 2010/0155718 | A1 | 6/2010 | Kirita et al. |
| 2010/0289020 | A1 | 11/2010 | Yano et al. |
| 2011/0001135 | A1 | 1/2011 | Chou et al. |
| 2011/0008931 | A1 | 1/2011 | Yamazaki et al. |
| 2011/0017990 | A1 | 1/2011 | Son et al. |
| 2011/0062861 | A1 | 3/2011 | Lee et al. |
| 2011/0121400 | A1 | 5/2011 | Larrieu et al. |
| 2011/0163310 | A1 | 7/2011 | Park et al. |
| 2011/0168993 | A1 | 7/2011 | Jeon et al. |
| 2011/0215305 | A1 | 9/2011 | Kim et al. |
| 2011/0227065 | A1 | 9/2011 | Shieh et al. |
| 2011/0240998 | A1 | 10/2011 | Morosawa et al. |
| 2011/0256684 | A1 | 10/2011 | Iwasaki et al. |
| 2011/0284846 | A1 | 11/2011 | Endo et al. |
| 2011/0291096 | A1 | 12/2011 | Ryoo et al. |
| 2011/0297945 | A1 | 12/2011 | Jung et al. |
| 2012/0146017 | A1* | 6/2012 | Kim .................... H01L 29/7869 257/43 |
| 2012/0161121 | A1 | 6/2012 | Yamazaki |
| 2012/0161123 | A1 | 6/2012 | Yamazaki |
| 2012/0161125 | A1 | 6/2012 | Yamazaki |
| 2012/0217493 | A1 | 8/2012 | Lee et al. |
| 2012/0286259 | A1* | 11/2012 | Park .................... H01L 29/66969 257/43 |
| 2012/0315730 | A1 | 12/2012 | Koezuka et al. |
| 2013/0001579 | A1* | 1/2013 | Jung .................... H01L 27/088 257/72 |
| 2013/0009145 | A1 | 1/2013 | Jeon et al. |
| 2013/0023086 | A1 | 1/2013 | Chikama et al. |
| 2013/0037793 | A1 | 2/2013 | Pan et al. |
| 2013/0043469 | A1 | 2/2013 | Kawamura et al. |
| 2013/0153910 | A1 | 6/2013 | Yamazaki et al. |
| 2013/0228777 | A1 | 9/2013 | Yamazaki et al. |
| 2013/0264568 | A1 | 10/2013 | Tomida et al. |
| 2013/0280859 | A1* | 10/2013 | Kim .................... H01L 29/7869 438/104 |
| 2013/0299826 | A1 | 11/2013 | Sakata et al. |
| 2013/0300968 | A1 | 11/2013 | Okajima et al. |
| 2013/0334530 | A1 | 12/2013 | Katoh et al. |
| 2013/0341629 | A1 | 12/2013 | Seo et al. |
| 2014/0054588 | A1 | 2/2014 | Maeda et al. |

FOREIGN PATENT DOCUMENTS

| | | |
|---|---|---|
| CN | 101894760 | 11/2010 |
| JP | 3489217 | 4/1996 |
| JP | 10209181 | 8/1998 |
| JP | 2006-108425 | 4/2006 |
| JP | 2007-220818 | 8/2007 |
| JP | 2007-250983 | 9/2007 |
| JP | 2008-083171 | 4/2008 |
| JP | 2009-528670 | 8/2009 |
| JP | 2010-040645 | 2/2010 |
| JP | 2011-035389 | 2/2011 |
| JP | 2011-519152 | 6/2011 |
| JP | 2011-222649 | 11/2011 |
| JP | 2011-228622 | 11/2011 |
| JP | 2012-009838 | 1/2012 |
| JP | 2013-016782 | 1/2013 |
| KR | 100214460 | 5/1999 |
| KR | 100328847 | 3/2002 |
| KR | 100809750 | 10/2002 |
| KR | 1020050001253 | 1/2005 |
| KR | 1020090127687 | 12/2009 |
| WO | 2007/142167 | 12/2007 |
| WO | 2009/075281 | 6/2009 |
| WO | 2009/136095 | 11/2009 |
| WO | 2011/125940 | 10/2011 |

OTHER PUBLICATIONS

Non Final Office Action issued on Feb. 6, 2014, in U.S. Appl. No. 13/683,468.
Final Office Action issued on Jun. 2, 2014, in U.S. Appl. No. 13/683,468.
Non Final Office Action issued on Oct. 7, 2014, in U.S. Appl. No. 13/683,468.
Non Final Office Action issued on Dec. 3, 2014, in U.S. Appl. No. 13/683,468.
Notice of Allowance issued on Mar. 20, 2015, in U.S. Appl. No. 13/683,468.
Ex Parte Quayle Action issued on Feb. 19, 2016, in U.S. Appl. No. 14/809,830.

* cited by examiner

FIG.13
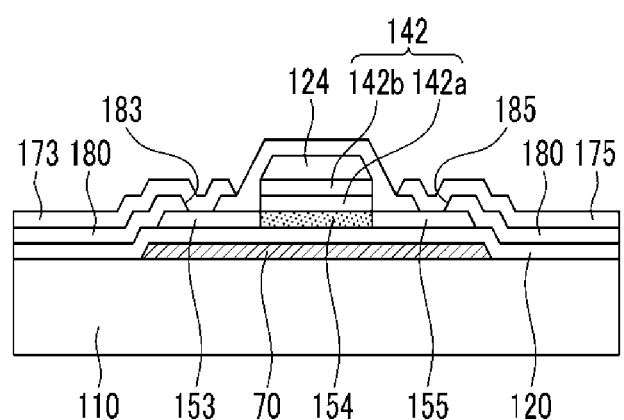
(a)
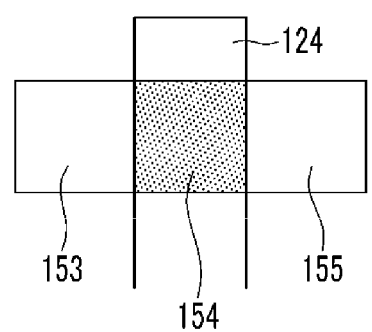
(b)

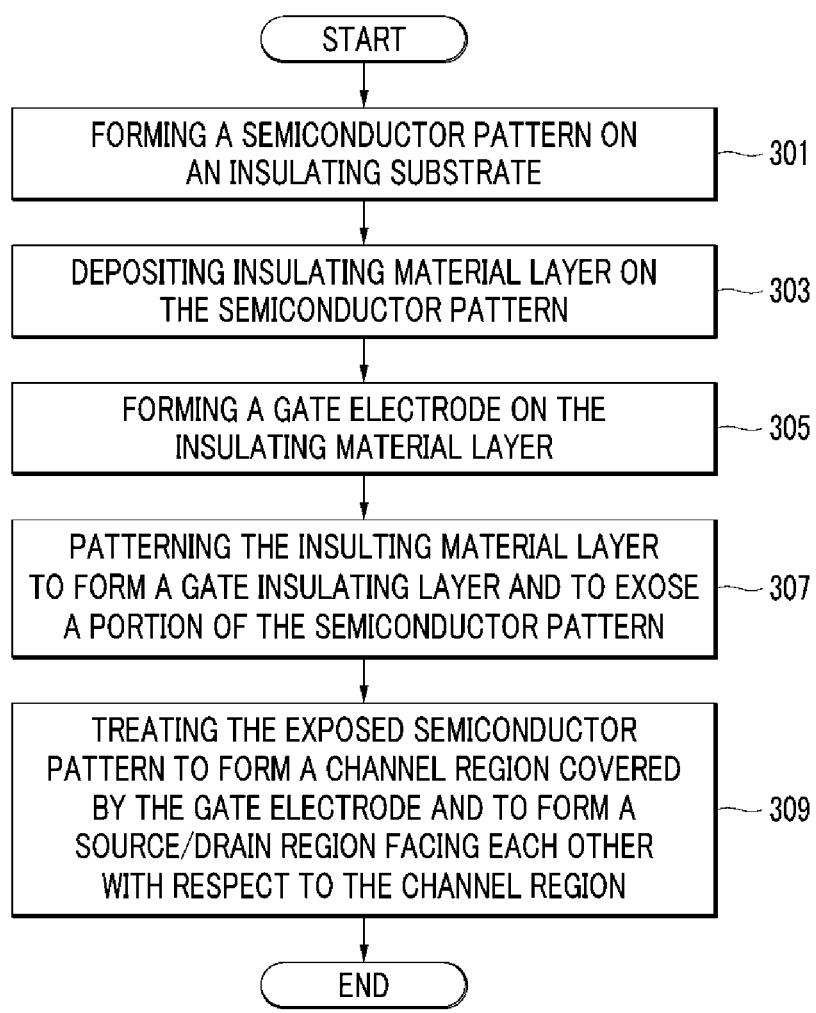

THIN FILM TRANSISTOR, THIN FILM TRANSISTOR ARRAY PANEL INCLUDING THE SAME, AND MANUFACTURING METHOD THEREOF

CROSS-REFERENCE TO RELATED APPLICATION

This application is a Divisional of prior U.S. patent application Ser. No. 13/683,468, filed on Nov. 21, 2012, which claims priority from and the benefit of Korean Patent Application No. 10-2012-0059605, filed on Jun. 4, 2012, which are hereby incorporated by reference for all purposes as if fully set forth herein.

BACKGROUND OF THE INVENTION

Field of the Invention

The present invention relates to a thin film transistor, a thin film transistor array panel, and a manufacturing method thereof.

Description of the Related Art

A thin film transistor (TFT) has been used in various electronic devices such as a flat panel display. For example, a thin film transistor has been used as a switching element or a driving element for a flat panel display such as a liquid crystal display (LCD), an organic light emitting diode (OLED) display, and an electrophoretic display.

Typically, a thin film transistor includes a gate electrode connected to a gate line transmitting a scanning signal, a source electrode connected to a data line transmitting a signal applied to a pixel electrode, a drain electrode facing the source electrode, and a semiconductor electrically connected to the source electrode and the drain electrode.

For higher TFT performance, fabricating transistor from thin film of a semiconductor is an important factor in determining characteristics of the thin film transistor. The semiconductor typically includes silicon (Si). The silicon can be divided into amorphous silicon and polysilicon according to a crystallization type, wherein the amorphous silicon has a simple manufacturing process, but has low charge mobility such that there is a limit in manufacturing a high performance thin film transistor using the amorphous silicon, while the polysilicon has high charge mobility, but additional, complicated processes of crystallizing the polysilicon may be required, thereby increasing the manufacturing time and cost.

To compensate weakness and benefit for the amorphous silicon and the polysilicon, various approaches have been tried for making a thin film transistor using an oxide semiconductor having higher electron mobility than the amorphous silicon, a high on/off ratio, and high uniformity, but a lower cost than the polysilicon.

However, if parasitic capacitance is generated between the gate electrode and the source electrode or the drain electrode of the thin film transistor, a characteristic of the thin film transistor as the switching element may be deteriorated despite the above various approaches.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention relates to improving a characteristic of a thin film transistor including an oxide semiconductor. Also, the present invention relates to reducing a kickback voltage caused by a parasitic capacitance in a thin film transistor array panel including a thin film transistor and a signal delay.

Exemplary embodiments of the present invention provide a thin film transistor. The thin film transistor includes a gate electrode. The transistor also includes a gate insulating layer positioned on or under the gate electrode. The transistor includes a channel region overlapping the gate electrode, the gate insulating layer interposed between the channel region and the gate electrode. The transistor includes a source region and a drain region, facing each other with respect to the channel region, disposed in the same layer as the channel region, and connected to the channel region, wherein the channel region, the source region, and the drain region comprise an oxide semiconductor, and wherein a carrier concentration of the source region and the drain region is larger than a carrier concentration of the channel region.

Exemplary embodiments of the present invention provide a method of manufacturing a thin film transistor array panel. The method includes forming a gate electrode on an insulation substrate. The method also includes depositing a gate insulating layer on the gate electrode. The method includes forming a semiconductor pattern on the gate insulating layer. The method includes forming an etch stopper intersecting and overlapping the semiconductor pattern on the semiconductor pattern. The method includes treating an exposed portion of the semiconductor pattern, thereby forming a source region and a drain region in the exposed portion of the semiconductor pattern, wherein a carrier concentration of the source region and the drain region is larger than a carrier concentration of the channel region, the channel region being a portion of the semiconductor pattern covered by the etch stopper.

Exemplary embodiments of the present invention provide a method of manufacturing a thin film transistor array panel. The method includes forming a semiconductor pattern comprising an oxide semiconductor on an insulation substrate. The method includes depositing an insulating material on the semiconductor pattern to form an insulating material layer. The method also includes forming a gate electrode on the insulating material layer. The method includes patterning the insulating material layer by using the gate electrode as an etching mask to form a gate insulating layer and to expose a portion of the semiconductor pattern. The method includes treating the exposed semiconductor pattern to form a channel region covered by the gate electrode, and to form a source region and a drain region facing each other with respect to the channel region, wherein a carrier concentration of the source region and the drain region is larger than a carrier concentration of the channel region.

According to exemplary embodiments of the present invention, parasitic capacitance between the gate electrode of the thin film transistor and the source region or the drain region of the semiconductor layer may be decreased and the characteristic of the thin film transistor may be improved. Also, in the thin film transistor array panel including the thin film transistor, a kickback voltage may be reduced and a signal delay and a distortion may be reduced.

It is to be understood that both the foregoing general description and the following detailed description are exemplary and explanatory and are intended to provide further explanation of the invention as claimed.

BRIEF DESCRIPTION OF THE DRAWINGS

FIG. 13 is a cross-sectional view (a) and a top plane view (b) of a thin film transistor array panel according to exemplary embodiments of the present invention.

FIGS. 29 and 30 are flowcharts of processes for manufacturing a thin film transistor array panel according to exemplary embodiments of the present invention.

DETAILED DESCRIPTION OF THE EMBODIMENTS

Figure 1:
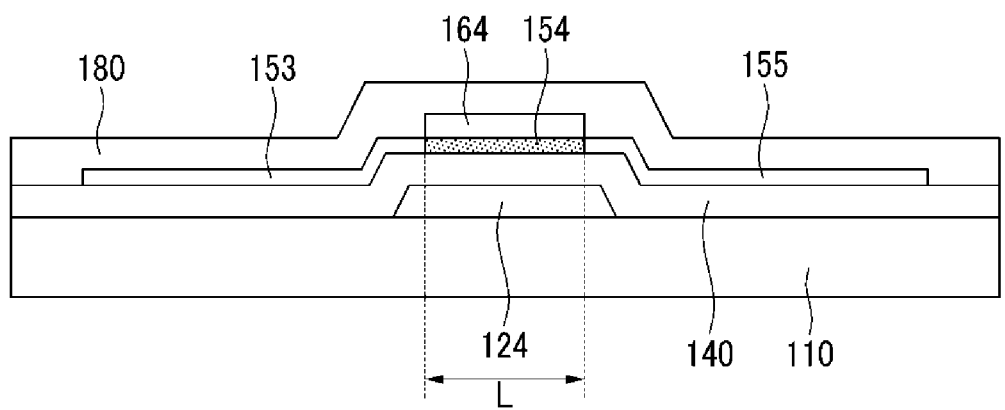
FIG. 1 is a cross-sectional view of a thin film transistor array panel according to exemplary embodiments of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, and regions may be exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that when an element or layer is referred to as being "on" or "connected to" another element or layer, it can be directly on or directly connected to the other element or layer, or intervening elements or layers may be present. In contrast, when an element or layer is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

FIG. 1 is a cross-sectional view of a thin film transistor array panel according to exemplary embodiments of the present invention.

A gate line 121 including a gate electrode 124 may be positioned on a substrate 110 including an insulating material such as plastic or glass. The gate line 121 (FIG. 2B) can transmit a gate signal including a gate-on voltage Von and a gate-off voltage Voff.

The gate line 121 may be made of a material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti). In an example, the gate line 121 may be made of a multilayered structure including at least two conductive layers having different physical properties.

A gate insulating layer 140 may be formed on the gate line 121. The gate insulating layer 140 may include an insulating material such as silicon oxide ($SiO_X$), silicon nitride ($SiN_X$), or silicon oxynitride (SiON). The gate insulating layer 140 may be formed through a sputtering method.

A semiconductor layer including a channel region 154, a source region 153, and a drain region 155 may be formed on the gate insulating layer 140.

The channel region 154 overlaps the gate electrode 124. A boundary between the channel region 154 and the source region 153 or the drain region 155 may be substantially aligned with an edge boundary of the gate electrode 124, or may be positioned inside or outside the edge boundary of the gate electrode 124. For example, the characteristic of the edge boundary of the channel region 154 being substantially aligned with the edge boundary of the gate electrode 124 may improve a characteristic of the thin film transistor and preventing signal delay in the thin film transistor array panel.

The channel region 154 may include an oxide semiconductor. The oxide semiconductor as a metal oxide semiconductor may be formed of an oxide of a metal such as zinc (Zn), indium (In), gallium (Ga), tin (Sn), and titanium (Ti), or the metal such as zinc (Zn), indium (In), gallium (Ga), tin (Sn), titanium (Ti), and the oxide combination thereof. For example, the oxide semiconductor material may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The source region 153 and the drain region 155 are positioned on both sides with respect to the channel region 154 and are separated from each other. By way of configuration, the source region 153 and the drain region 155 may overlap the gate electrode 124. Alternatively, for example, the source region 153 and the drain region 155 may not overlap the gate electrode 124

The source region 153 and the drain region 155 are physically and electrically connected to the channel region 154.

In some examples, the source region 153 and the drain region 155 include the oxide semiconductor forming the channel region 154, however a carrier concentration of the source region 153 and the drain region 155 may be different from the carrier concentration of the channel region 154. For example, when the carrier concentration of the channel region 154 is less than $10^{18}$ units/cm$^3$, the carrier concentration of the source region 153 and the drain region 155 is equal to or more than $10^{18}$ units/cm$^3$. As an exemplary embodiment, a gradient of the carrier concentration may be formed in the boundary between the source region 153 or the drain region 155 and the channel region 154.

According to exemplary embodiments of the present invention, the source region 153 and the drain region 155 may include the oxide semiconductor forming the channel region 154 and a reduced oxide semiconductor. For example, the source region 153 and the drain region 155 may include the oxide semiconductor and at least one of fluorine (F), hydrogen (H), and sulfur (S). In this example, a concentration of at least one of fluorine (F), hydrogen (H), and sulfur (S) included in the source region 153 and the drain region 155 may be equal to or more than $10^{15}$ units/cm$^3$. The gradient of at least one concentration of fluorine (F), hydrogen (H), and sulfur (S) may be formed in the boundary between the source region 153 or the drain region 155 and the channel region 154.

The source region 153 and the drain region 155 may be formed by reducing the oxide semiconductor forming the channel region 154 by a plasma treatment. For example, the oxide semiconductor may be doped with at least one of fluorine (F), hydrogen (H), and sulfur (S) by using a gas including at least one of fluorine (F), hydrogen (H), and sulfur (S) in a chamber, thereby forming the source region 153 and the drain region 155 according to exemplary embodiments of the present invention.

The oxide semiconductor may be an n-type semiconductor such that the source region 153 and the drain region 155 doped with at least one gas among fluorine (F), hydrogen (H), and sulfur (S) become n+ layers. In this example, the source region 153 and the drain region 155 function as ohmic contacts between the electrode and the semiconductor layer.

According to exemplary embodiments, the source region 153 and the drain region 155 may function as a source electrode and a drain electrode having conductivity.

An etch stopper (referred to as an etching preventing layer) 164 may be formed on the channel region 154. Right and left edge boundaries of the etch stopper 164 may be substantially aligned with the right and left edge boundaries of the channel region 154. Accordingly, the etch stopper 164 may not substantially overlap the source region 153 or the drain region 155.

The etch stopper 164 may cover the channels of the semiconductor 154 such that damage to the channel of the thin film transistor by the etchant may be prevented in following processes. For example, the etch stopper 164 can prevent an impurity such as hydrogen (H) from being diffused into the semiconductor 154 from an insulating layer of a passivation layer 180 positioned on the semiconductor 154 or the outside, thereby preventing a change of the characteristics of the semiconductor 154.

In some examples, the thickness of the etch stopper 164 may be equal to or less than about 3000 Å, and the etch stopper 164 may be formed of the inorganic layer including at least one material of $SiO_X$, $SiN_X$, $SiOC_X$, and $SiON_X$, or the organic layer including the organic material or a polymer organic material.

When the source region 153 and the drain region 155 perform the function of the source electrode and the drain electrode, the gate electrode 124 and the source region 153 and drain region 155 of the semiconductor layer form a thin film transistor (TFT) along with the channel region 154, and a channel of the thin film transistor may be formed in the channel region 154.

A channel length L of the thin film transistor may be defined by a distance between the source region 153 and the drain region 155, that is, a horizontal direction width of the channel region 154. Also, a channel width (not shown) of the thin film transistor may be defined by a length of the boundary between the source region 153 or the drain region 155 and the channel region 154. According to exemplary embodiments of the present invention, the channel length L of the thin film transistor depends on the horizontal direction width of the etch stopper 164, and when forming the etch stopper 164 by a photolithography process, the channel length L may be reduced to an exposure limit of a light exposer. For example, when the exposure limit of the light exposer is about 3 μm, the channel length (L) of the thin film transistor may be reduced to about 3 μm such that mobility of the thin film transistor may be increased, thereby improving the characteristic of the thin film transistor.

Also, according to exemplary embodiments of the present invention, the channel length L of the thin film transistor is the about same as the horizontal direction width of the etch stopper 164 such that the channel length L of the thin film transistor may be controlled by controlling the horizontal direction width of the etch stopper 164. Accordingly, the position of the boundary between the channel region 154 and the source region 153 or the drain region 155 for the edge boundary of the gate electrode 124 may be determined. It is contemplated that the boundary between the channel region 154 and the source region 153 or the drain region 155 substantially aligned with or is positioned outside the edge boundary of the gate electrode 124, the source region 153 and the drain region 155 do not substantially overlap the gate electrode 124 such that the parasitic capacitance between the gate electrode 124 and the source region 153 or the drain region 155 may be remarkably reduced. Accordingly, in the thin film transistor array panel, the kickback voltage by the parasitic capacitance between the gate electrode 124 and the source region 153 or the drain region 155, and the signal delay or a distortion, may be reduced. Accordingly, power consumption may be reduced, the thickness of a signal transmitting wiring (not shown) such as the data line may be further reduced, and freedom for wiring material selection may be increased.

The passivation layer 180 is positioned on the source region 153, the drain region 155, and the etch stopper 164. The passivation layer 180 may be made of an insulating material such as silicon oxide ($SiO_x$), silicon nitride ($SiN_x$), silicon nitroxide (SiON), and fluorine-doped silicon oxide (SiOF).

Figure 2A:
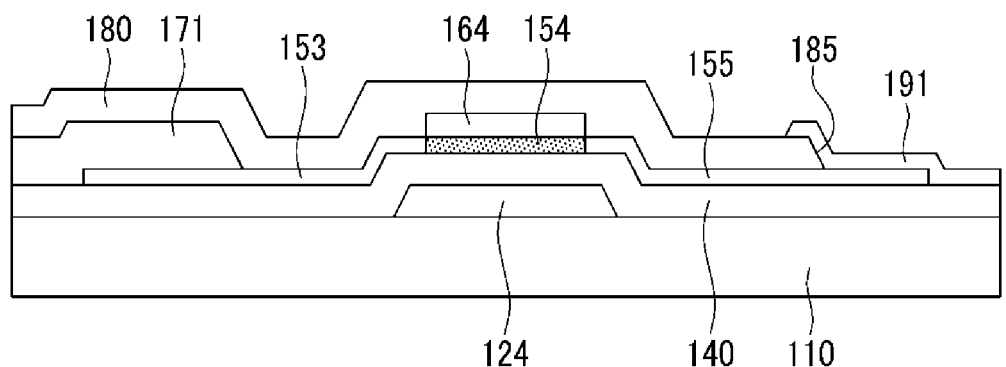
FIG. 2A is a cross-sectional view of a thin film transistor array panel according to exemplary embodiments of the present invention.
Figure 2B:
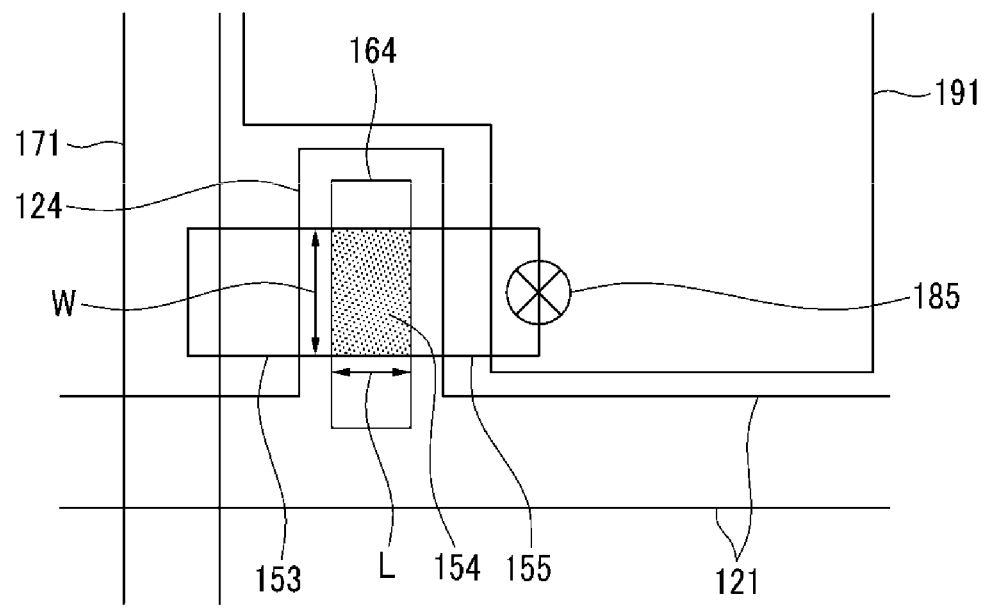
FIG. 2B is a top plan view of the thin film transistor array panel shown in FIG. 2A.
Figure 3A:
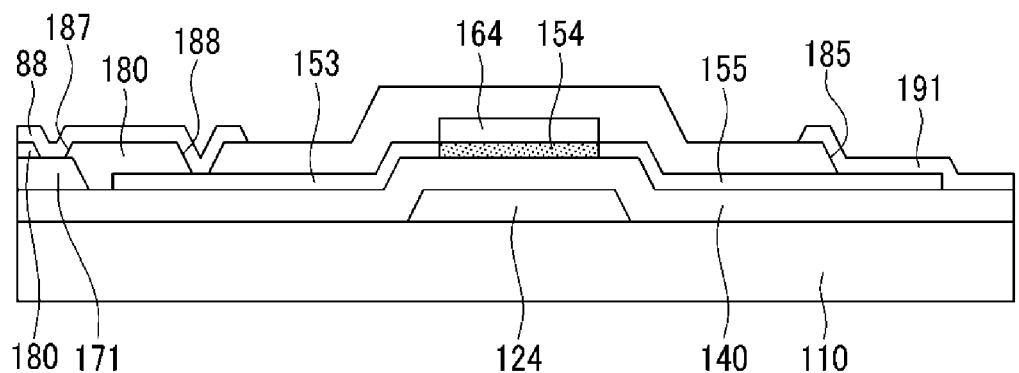
FIG. 3A is a cross-sectional view of a thin film transistor array panel according to exemplary embodiments of the present invention.
Figure 3B:
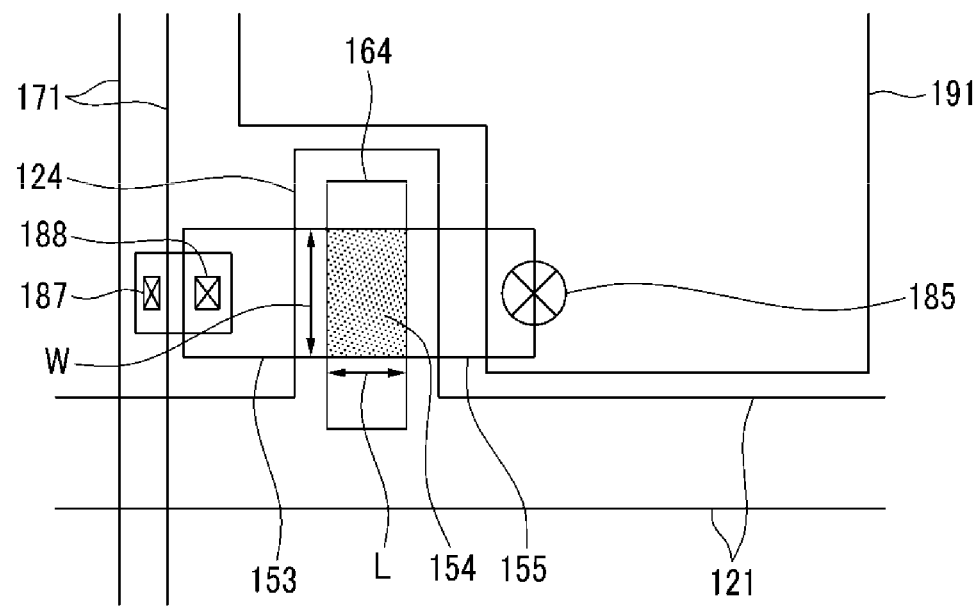
FIG. 3B is a top plan view of the thin film transistor array panel shown in FIG. 3A.

FIG. 2A is a cross-sectional view of a thin film transistor array panel according to exemplary embodiments of the present invention, FIG. 2B is a top plan view of the thin film transistor array panel shown in FIG. 2A, FIG. 3A is a cross-sectional view of a thin film transistor array panel according to exemplary embodiments of the present invention, and FIG. 3B is a top plan view of the thin film transistor array panel shown in FIG. 3A.

The exemplary embodiments shown in FIG. 2A and FIG. 2B may be the same as most of the exemplary embodiment shown in FIG. 1, however it may further include a data line 171 connected to the source region 153 and a pixel electrode 191 connected to the drain region 155.

The data line 171 may transmit a data signal and cross the gate line 121 while being insulated from the gate line 121. The data line 171 is electrically connected to the source region 153.

Referring to FIG. 2A and FIG. 2B, for example, the data line 171 directly contacts the source region 153 to be electrically connected thereto.

In this example, the data line 171 may be positioned under the passivation layer 180. Also, the data line 171 may include a protrusion (not shown) protruded toward the source region 153, and the protrusion may contact the source region 153.

Referring to FIG. 3A and FIG. 3B, the data line 171 may be electrically connected to the source region 153 through a bridge 88. In this example, the data line 171 may be disposed under the passivation layer 180, and the passivation layer 180 may include a contact hole 187 exposing the data line 171 and a contact hole 188 exposing the source region 153. The bridge 88 may electrically connect the data line 171 and the source region 153 through the contact holes 187 and 188. The data line 171 may be disposed between the gate insulating layer 140 and the passivation layer 180, and may be disposed on the passivation layer 180. When the data line 171 is disposed under the passivation layer 180, the bridge 88 may be formed in the same layer and with the same material as the pixel electrode 191.

The pixel electrode 191 is positioned on the passivation layer 180 and may be made of a transparent conductive material such as ITO and IZO. The pixel electrode 191 may be electrically connected to the drain region 155 through the contact hole 185 of the passivation layer 180. The pixel electrode 191 receives the data voltage from the drain region 155, thereby displaying images.

When the thin film transistor array panel according to exemplary embodiments of the present invention is included in the liquid crystal display, the pixel electrode 191 forms an electric field to a liquid crystal layer (not shown) along with an opposed electrode (not shown) to control an arrangement direction of liquid crystal molecules, thereby displaying the image. When the thin film transistor array panel according to exemplary embodiments of the present invention is included in an organic light emitting device, an emission layer (not shown) is positioned between the pixel electrode 191 and the opposed electrode (not shown) thereby forming a light emitting diode (LED).

In some exemplary embodiments of the present invention, it is not necessary for the data line 171 or the pixel electrode 191 to directly contact the channel region 154 of the thin film transistor. Accordingly, a distance may be somehow provided between the data line 171 and the pixel electrode 191, and the channel region 154, such that a metal component of the data line 171 may be prevented from being diffused into the channel region 154, particularly when the data line 171 includes a metal such as copper (Cu). Accordingly, the characteristic deterioration of the thin film transistor may be prevented.

Figure 4A:
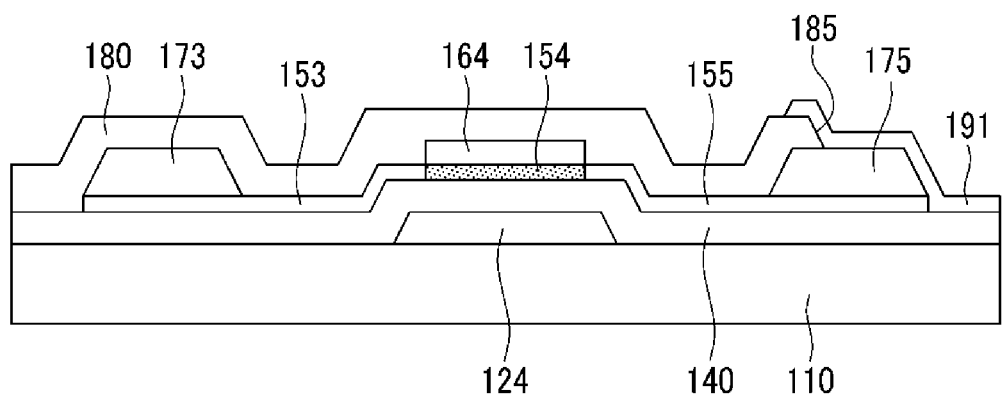
FIG. 4A is a cross-sectional view of a thin film transistor array panel according to exemplary embodiments of the present invention.
Figure 4B:
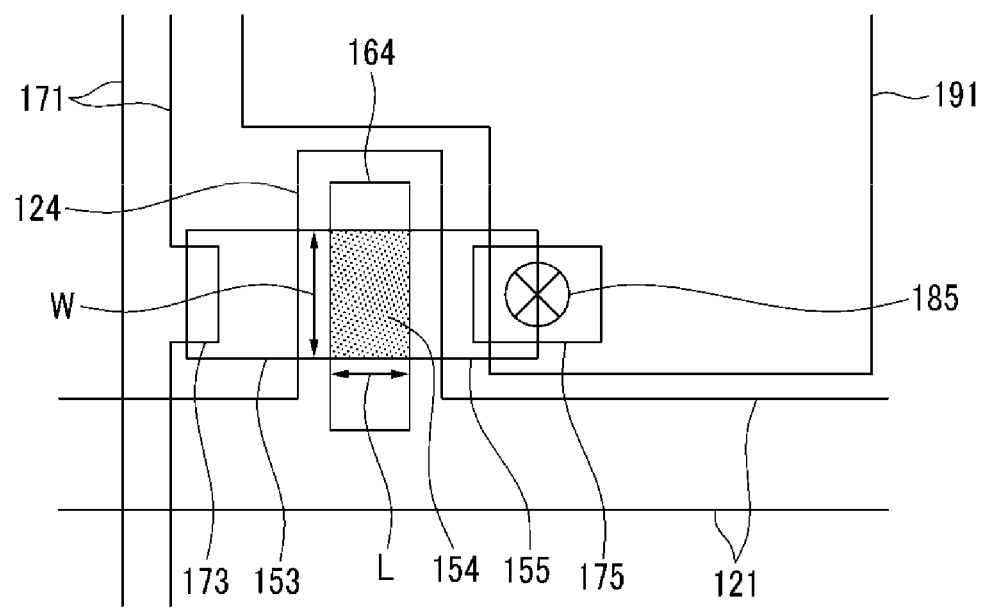
FIG. 4B is a top plan view of the thin film transistor array panel shown in FIG. 4A.

FIG. 4A is a cross-sectional view of a thin film transistor array panel according to exemplary embodiments of the present invention, and FIG. 4B is a top plan view of the thin film transistor array panel shown in FIG. 4A.

The exemplary embodiments shown in FIG. 4A and FIG. 4B may be the same as most of the exemplary embodiment of FIG. 1, however a source electrode 173 on the source region 153, a drain electrode 175 on the drain region 155, and a pixel electrode 191 electrically connected to the drain electrode 175 may be further included. In this example, the source electrode 173 directly contacts the source region 153 to be electrically connected thereto, and the drain electrode 175 directly contacts the drain region 155 to be electrically connected thereto.

If the oxide semiconductor region is reduced by a method such as plasma treatment to form the source region 153 and the drain region 155, the source region 153 and the drain region 155 doped with at least one gas of fluorine (F), hydrogen (H), and sulfur (S) become the n+ layer such that they may function as the ohmic contact between the source electrode 173 and the drain electrode 175, and the channel layer 154.

In FIG. 4A, for example, the source electrode 173 and the drain electrode 175 may be thicker than the source region 153 and the drain region 155. In another exemplary embodiment, the source electrode 173 and the drain electrode 175 may have the thickness that is equal to or thinner than that of the source region 153 and the drain region 155.

The source electrode 173 transmits the data signal and is connected to the data line 171. For example, the source electrode 173 may be a portion protruded from a portion of the data line 171, as exemplarily shown in FIG. 4B. As another example, the source electrode 173 may be separately formed from the data line 171 and may be connected to the data line 171, similar to arrangement of FIGS. 3A and 3B The pixel electrode 191 may be positioned on the passivation layer 180 and may be formed of the transparent conductive material such as ITO and IZO. The pixel electrode 191 is electrically connected to the drain electrode 175 through the contact hole 185 of the passivation layer 180. The pixel electrode 191 receives the data voltage from the drain electrode 175 thereby controlling the display of an image.

The source electrode 173 and the drain electrode 175 may be made of a material such as an aluminum-based metal of aluminum (Al) or aluminum alloys, a silver-based metal of silver (Ag) or silver alloys, a copper-based metal of copper (Cu) or copper alloys, a molybdenum-based metal of molybdenum (Mo) or molybdenum alloys, chromium (Cr), tantalum (Ta), and titanium (Ti). For example, as the molybdenum alloy, there are Mo—Nb and Mo—Ti. The source electrode 173 and the drain electrode 175 may be made of a transparent conductive material such as ITO, IZO, and AZO. The source electrode 173 and the drain electrode 175 may be made of a multilayered structure including at least two conductive layers (not shown). For example, the source electrode 173 and the drain electrode 175 may have a multilayered structure of Mo/Al/Mo, Mo/Al, Mo/Cu, CuMn/Cu, or Ti/Cu.

In the present exemplary embodiments, it is not necessary for the source electrode 173 and the drain electrode 175 to contact the channel region 154. Accordingly, a distance may be somehow provided between the source electrode 173 and the drain electrode 175, and the channel region 154, such that a metal component of the source electrode 173 and the drain electrode 175 may be prevented from being diffused into the channel region 154, particularly when the source electrode 173 and the drain electrode 175 include the metal such as copper (Cu). Accordingly, the characteristic deterioration of the thin film transistor may be prevented.

Figure 5:
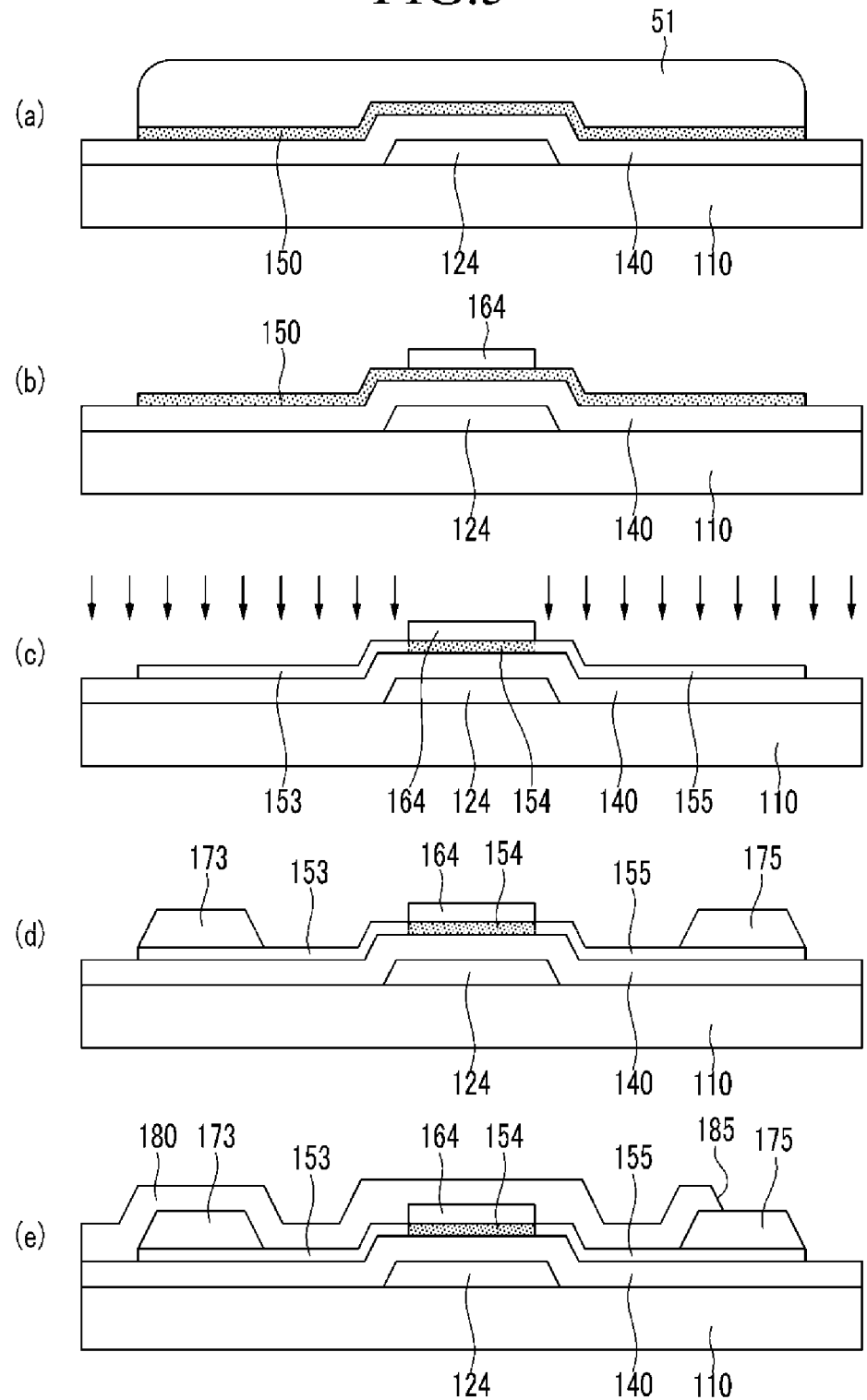
FIG. 5 is a cross-sectional view sequentially showing a manufacturing method of a thin film transistor array panel according to exemplary embodiments of the present invention.

FIG. 5 is a cross-sectional view sequentially showing a manufacturing method of a thin film transistor array panel according to exemplary embodiments of the present invention.

In the present exemplary embodiments, the thin film transistor array panel shown in FIG. 4A and FIG. 4B is described as an example, however it is not limited thereto, and the manufacturing method according an exemplary embodiments of the present invention may be equally applied to different various exemplary embodiments.

Referring to FIG. 5 (a), a conductive material such as a metallic material is deposited and patterned on an insulation substrate 110 made of glass or plastic to form a gate electrode 124.

A gate insulating layer 140 including the insulating material such as silicon oxide ($SiO_X$), silicon nitride ($SiN_X$), or silicon nitroxide (SiON) is deposited on the gate electrode 124.

The semiconductor layer (not shown) made of the oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO) is coated on the gate insulating layer 140, and then a photosensitive film such as photoresist is coated and exposed to form a photosensitive film pattern 51.

The semiconductor material layer is etched by using the photosensitive film pattern 51 as a mask to form a semiconductor pattern 150.

Referring to FIG. 5 (b), the photosensitive film pattern 51 is removed and an etch stopper 164 is formed on the semiconductor pattern 150. The etch stopper 164 overlaps the gate electrode 124 and intersects the center portion of the semiconductor pattern 150 to overlap it, and portions of the semiconductor pattern 150 that are not covered by the etch stopper 164 are positioned to be separated from each other with the etch stopper 164 interposed therebetween. The etch stopper 164 may be formed by depositing the inorganic layer including at least one material of $SiO_X$, $SiN_X$, $SiOC_X$, and $SiON_X$, or the organic layer including the organic material or a polymer organic material by a chemical vapor deposition (CVD) or a sputtering method and patterning through a photo-process. In this example, the dry etch method may be used, and an etching gas having an etch rate that does not etch the semiconductor pattern 150 may be used.

Referring to FIG. 5 (c), portions of the semiconductor pattern 150 exposed by the etch stopper 164 are treated to form the source region 153 and the drain region 155. Also, the semiconductor pattern 150 covered by the etch stopper 164 becomes the channel region 154. Accordingly, the gate electrode 124, the source region 153, and the drain region 155 form the thin film transistor along with the channel region 154.

As methods for treating the exposed semiconductor pattern 150, for example, there are a heat treatment in a reduction atmosphere in a chamber, and a plasma treatment using a gas plasma such as such as hydrogen ($H_2$), helium (He), phosphine ($PH_3$), ammonia ($NH_3$), silane ($SiH_4$), methane ($CH_4$), acetylene ($C_2H_2$), diborane ($B_2H_6$), carbon dioxide ($CO_2$), germane ($GeH_4$), hydrogen selenide ($H_2Se$), hydrogen sulfide ($H_2S$), argon (Ar), nitrogen ($N_2$), nitrogen oxide ($N_2O$), and fluoroform ($CHF_3$).

Particularly, according to exemplary embodiments of the present invention, the method of doping or reducing the exposed semiconductor pattern 150 with at least one of fluorine (F), hydrogen (H), and sulfur (S) by using the gas including at least one of tetrafluoromethane ($CF_4$), nitrogen trifluoride ($NF_3$), sulfur hexafluoride ($SF_6$), and methane ($CH_4$) is used. Accordingly, as described above, the source region 153 and the drain region 155 including at least one of fluorine (F), hydrogen (H), and sulfur (S) may be formed along with the oxide semiconductor of the channel region 154. In this example, at least one concentration of fluorine (F), hydrogen (H), and sulfur (S) doped to the source region 153 and the drain region 155 may be equal to or more than about $10^{15}$ units/cm$^3$.

Referring to FIG. 5 (d), a source electrode 173 and a drain electrode 175 may be further formed on the source region 153 and the drain region 155.

Referring to FIG. 5 (e), an insulating material is coated on the source electrode 173 and the drain electrode 175, the source region 153 and the drain region 155, and the etch stopper 164 to form a passivation layer 180. The passivation layer 180 is patterned to form a contact hole 185 exposing the drain electrode 175.

As shown in FIG. 2A, FIG. 2B, FIG. 3A, FIG. 3B, FIG. 4A, and FIG. 4B, a pixel electrode 191 electrically connected to the drain electrode 175 or the drain region 155 may be formed on the passivation layer 180.

In the thin film transistor manufactured by the manufacturing method according to exemplary embodiments of the present invention, the width of the etch stopper 164 is controlled in the exposure limitation such that the source region 153 and the drain region 155 of the semiconductor layer may be formed to not substantially overlap the gate electrode 124, thereby reducing the parasitic capacitance between the gate electrode 124 and the source region 153 or the drain region 155 and improving an on/off characteristic as the switching element of the thin film transistor. Also, the power consumption of the thin film transistor may be reduced, the thickness of the signal transmitting wiring may be reduced, and the freedom of the wiring material selection may be increased.

Also, the channel length L of the thin film transistor may be reduced to the exposure limitation of the light exposer such that the mobility may be increased, thereby improving the characteristic of the thin film transistor.

The same constituent elements as in the exemplary embodiments described above use the same reference numerals and the same description may be omitted to avoid unnecessarily obscuring the present invention.

Figure 6:
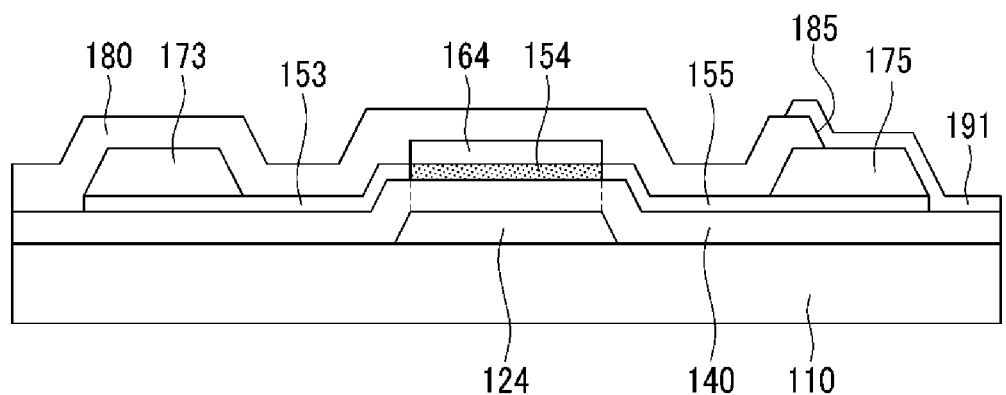
FIG. 6 is a cross-sectional view of a thin film transistor array panel according to exemplary embodiments of the present invention.
Figure 7:
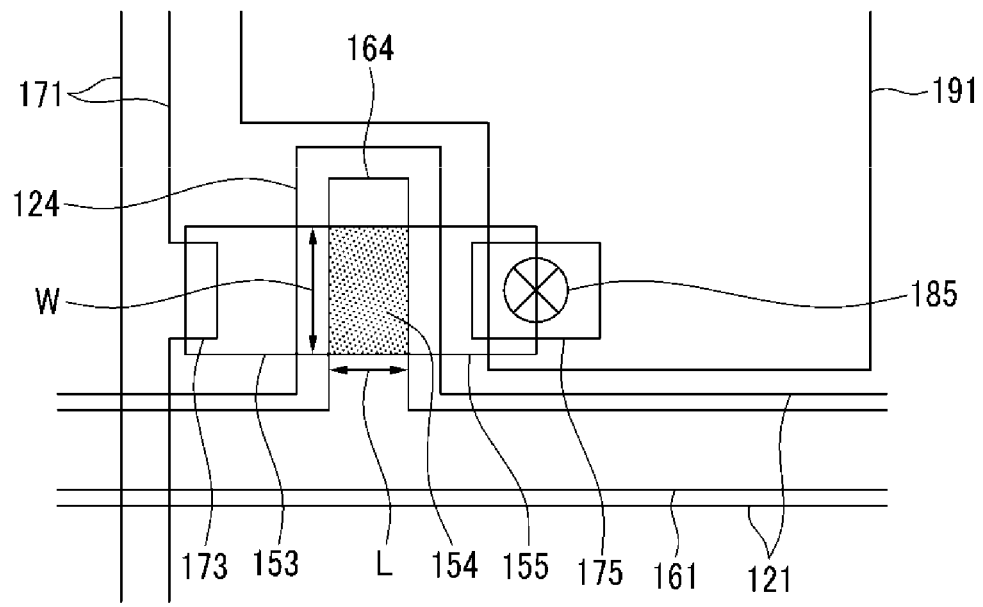
FIG. 7 is a top plan view of the thin film transistor array panel shown in FIG. 6.

FIG. 6 is a cross-sectional view of a thin film transistor array panel according to exemplary embodiments of the present invention, and FIG. 7 is a top plan view of the thin film transistor array panel shown in FIG. 6.

The present exemplary embodiment is the same as most of the thin film transistor array panel according to the exemplary embodiments shown in FIG. 2A to FIG. 4B except for a linear etch stopper 161 extending parallel to the gate line 121 and connected to an etch stopper 164.

An edge boundary of the linear etch stopper 161 including the etch stopper 164 may be aligned with the edge boundary of the gate line 121 including the gate electrode 124, or may be positioned inside or outside of the edge boundary of the gate line 121. For example, the plane shape of the linear etch stopper 161 including the etch stopper 164 may be substantially the same as or similar to the plane shape of the gate line 121 including the gate electrode 124.

The channel region 154 is covered by the etch stopper 164, and the edge boundary of the channel region 154, for example, the boundary between the channel region 154 and the source region 153 or the drain region 155, may substantially be aligned with or may be positioned slightly inside the edge boundary of the etch stopper 164.

According to the present exemplary embodiments, the area where the gate electrode 124 overlaps the source region 153 or the drain region 155 may be minimized such that the parasitic capacitance between the gate electrode 124 and the source region 153 or the drain region 155 may be remarkably reduced.

Figure 8:
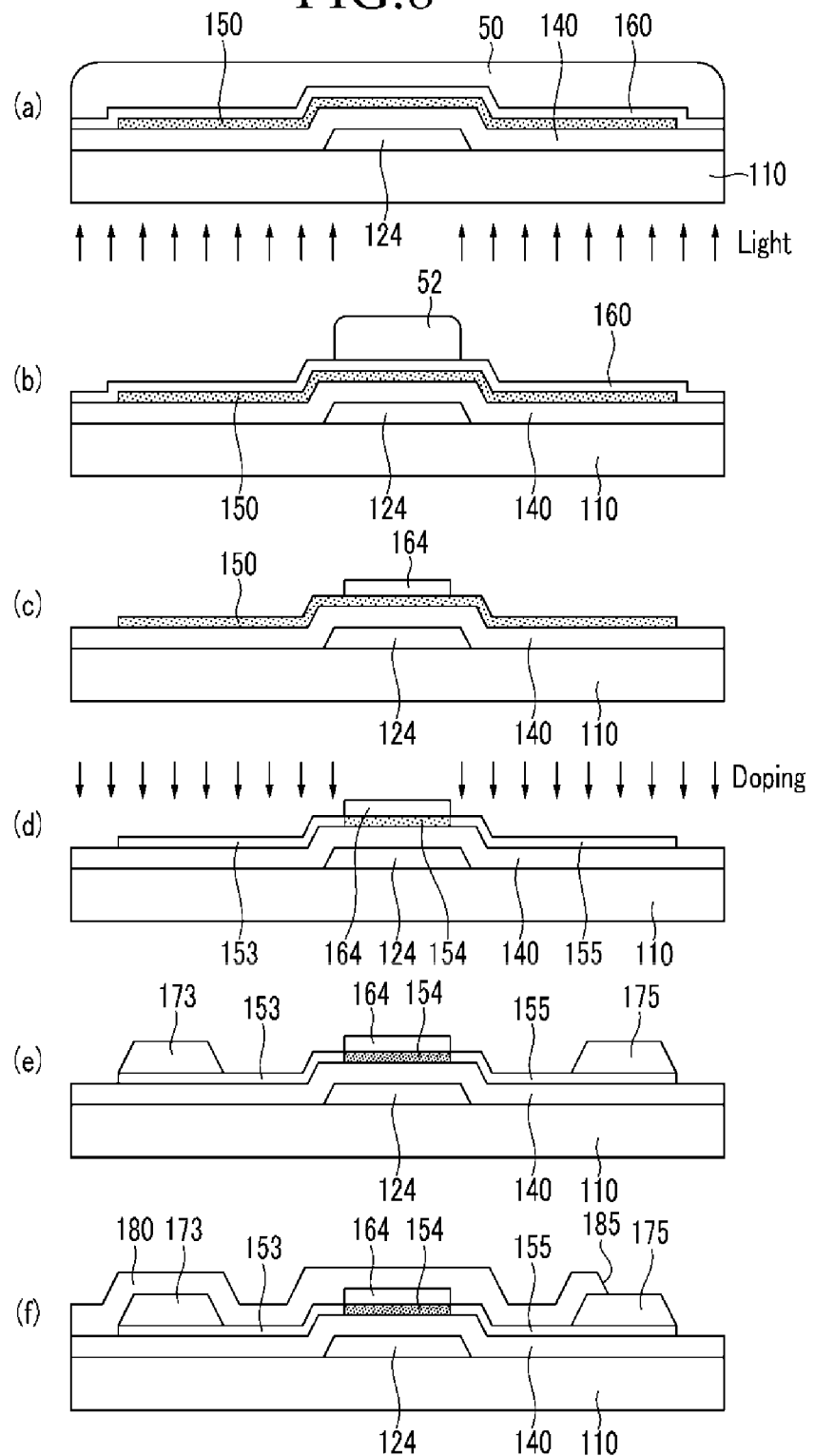
FIG. 8 is a cross-sectional view sequentially showing a manufacturing method of a thin film transistor array panel according to exemplary embodiments of the present invention.

FIG. 8 is a cross-sectional view sequentially showing a manufacturing method of a thin film transistor array panel according to exemplary embodiments of the present invention.

Referring to FIG. 8 (*a*), a conductive material such as the metal is deposited and patterned on an insulation substrate 110 made of glass or plastic to form a gate electrode 124.

A gate insulating layer 140 including the insulating material such as silicon oxide ($SiO_x$), silicon nitride ($SiN_x$), or silicon nitroxide (SiON) is deposited on the gate electrode 124.

A semiconductor pattern 150 including the oxide semiconductor material is formed on the gate insulating layer 140, and the inorganic layer including at least one material of $SiO_x$, $SiN_x$, $SiOC_x$, and $SiON_x$, or the organic layer including the organic material or a polymer organic material, is deposited by a chemical vapor deposition (CVD) or sputtering method to form an etch stopper layer 160.

A photosensitive film 50 such as photoresist is coated on the etch stopper layer 160 and light is irradiated from a rear (bottom) side of the insulation substrate 110. In this example, the photosensitive film 50 has positive photosensitivity such that an exposed portion thereof is removed. Thus, the photosensitive film 50 that is not covered by the opaque gate electrode 124 is exposed, thereby being removed.

Referring to FIG. 8 (*b*), the exposed photosensitive film 50 is removed to form a photosensitive film pattern 52 corresponding to the gate electrode 124. In this example, the edge boundary of the photosensitive film pattern 52 may be aligned with the edge boundary of the gate electrode 124, and may be positioned slightly inside or outside the edge boundary of the gate electrode 124. This may be determined by various design factors such as a wavelength of the light used in the light exposer, or a kind of material passing the light.

Referring to FIG. 8 (*c*), the etch stopper layer 160 is etched by using the photosensitive film pattern 52 as a mask to form the etch stopper 164 intersecting and covering the semiconductor pattern 150.

Referring to FIG. 8 (*d*), two portions of the semiconductor pattern 150 that are not covered by the etch stopper 164 and are exposed are doped with ions to form the source region 153 and the drain region 155 having conductivity. The semiconductor pattern 150 covered by the etch stopper 164 becomes the channel region 154. Accordingly, the gate electrode 124, the source region 153, and the drain region 155 form the thin film transistor along with the channel region 154.

The method of treating the exposed semiconductor pattern 150 is the same as that of the above-described exemplary embodiments such that the detailed description may be omitted.

Referring to FIG. 8 (*e*), a source electrode 173 and a drain electrode 175 may be further formed on the source region 153 and the drain region 155.

Referring to FIG. 8 (*f*), an insulating material is coated on the source electrode 173 and the drain electrode 175, the source region 153 and the drain region 155, and the etch stopper 164 to form a passivation layer 180. The passivation layer 180 is patterned to form a contact hole 185 exposing the drain electrode 175, and as shown in FIG. 6 and FIG. 7, a pixel electrode 191 electrically connected to the drain electrode 175 or the drain region 155 may be formed on the passivation layer 180.

Figure 9:
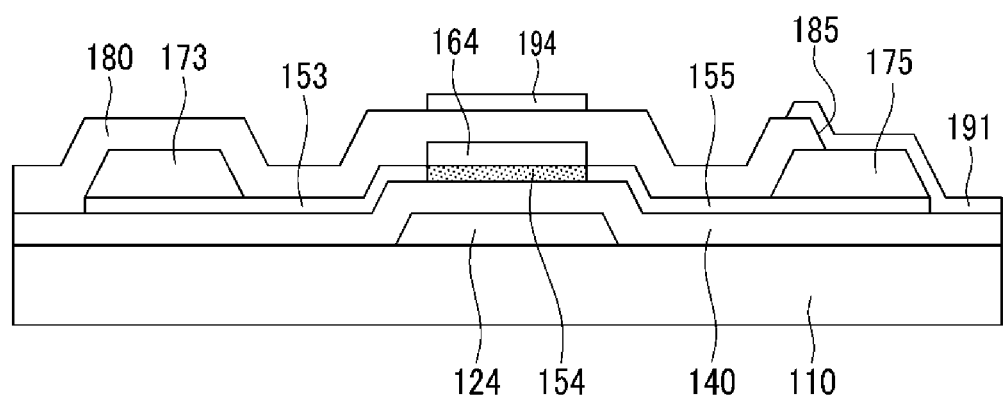
FIG. 9 is a cross-sectional view of a thin film transistor array panel according to exemplary embodiments of the present invention.
Figure 10:
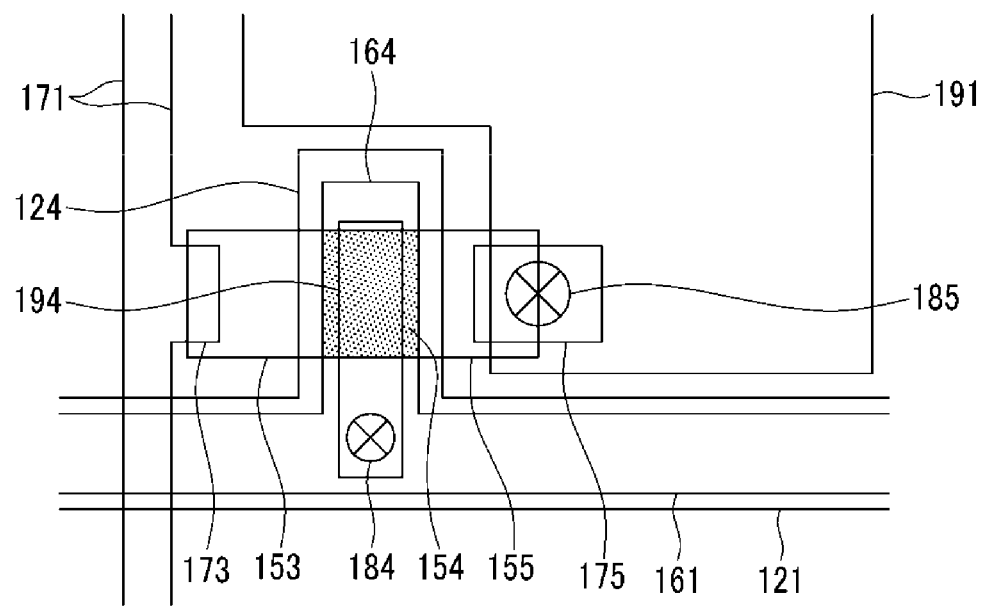
FIG. 10 is a top plan view of the thin film transistor array panel shown in FIG. 9.

FIG. 9 is a cross-sectional view of a thin film transistor array panel according to exemplary embodiments of the present invention, and FIG. 10 is a top plan view of the thin film transistor array panel shown in FIG. 9.

The present exemplary embodiment is the same as most of the thin film transistor array panel according to the exemplary embodiment shown in FIG. 2A to FIG. 4B except for an upper gate electrode 194 facing the gate electrode 124 on the passivation layer 180. The upper gate electrode 194 may include the same material as the pixel electrode 191, and may be simultaneously formed with the pixel electrode 191.

Referring to FIG. 10, the upper gate electrode 194 contacts the gate line 121 to be electrically connected thereto, thereby receiving the gate signal from the gate line 121. In this example, the passivation layer 180 and the gate insulating layer 140 have a contact hole 184 exposing the gate line 121, and the upper gate electrode 194 may be connected to the gate line 121 through the contact hole 184. The horizontal direction width of the upper gate electrode 194 may be equal to or less than the horizontal direction width of the channel region 154.

Figure 11:
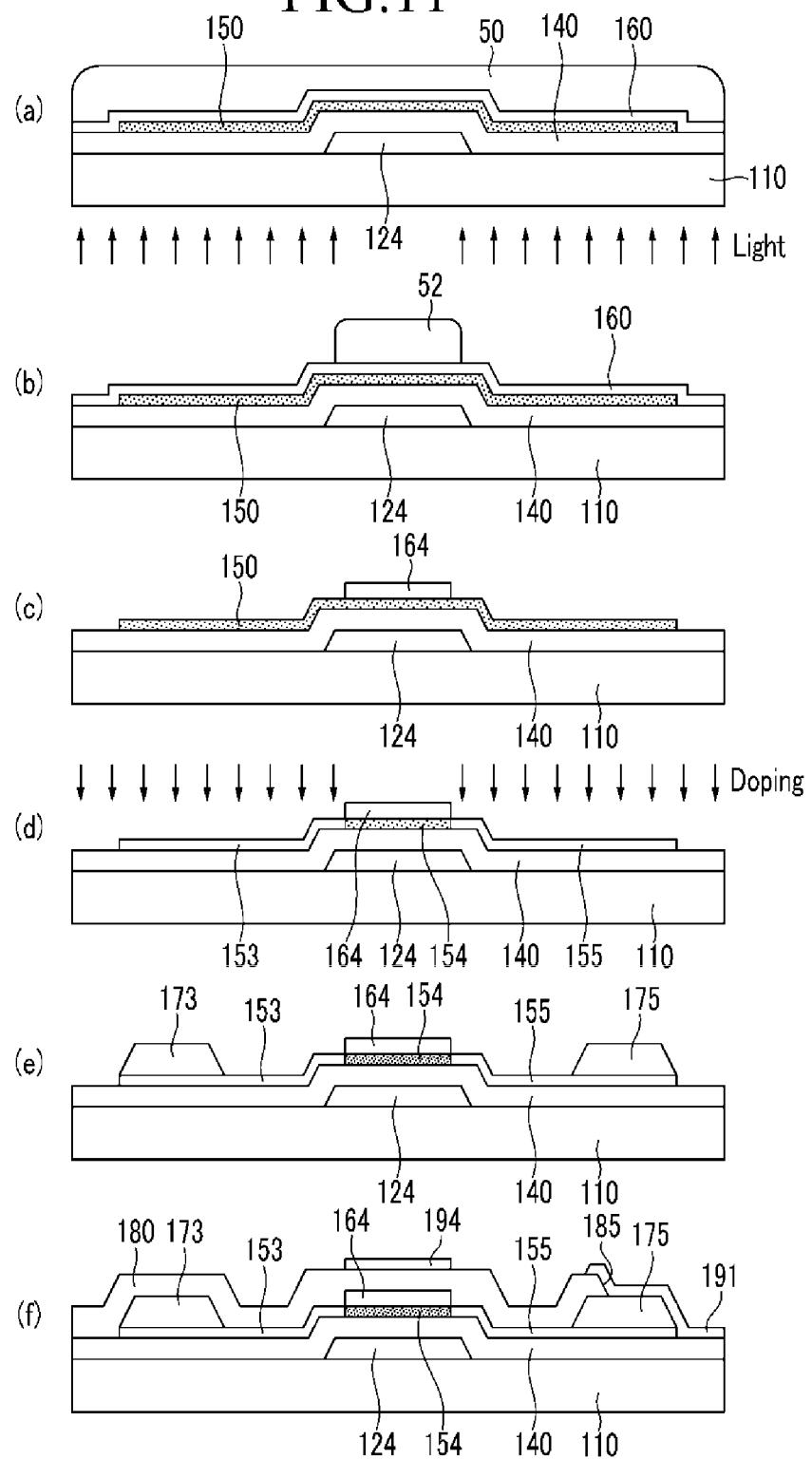
FIG. 11 is a cross-sectional view sequentially showing a manufacturing method of the thin film transistor array panel shown in FIG. 9 and FIG. 10 according to an exemplary embodiment of the present invention.

FIG. 11 is a cross-sectional view sequentially showing a manufacturing method of the thin film transistor array panel shown in FIG. 9 and FIG. 10 according to exemplary embodiments of the present invention.

The manufacturing method of the thin film transistor according to the present exemplary embodiments is the same as most of the manufacturing method of the thin film transistor according to the exemplary embodiment shown in FIG. 8 such that the detailed description may be omitted. However, referring to FIG. 11 (*f*), when forming the pixel electrode 191 with the transparent conductive material such as ITO and IZO, the upper gate electrode 194 positioned on the channel region 154 may be formed at the same time.

Figure 12:
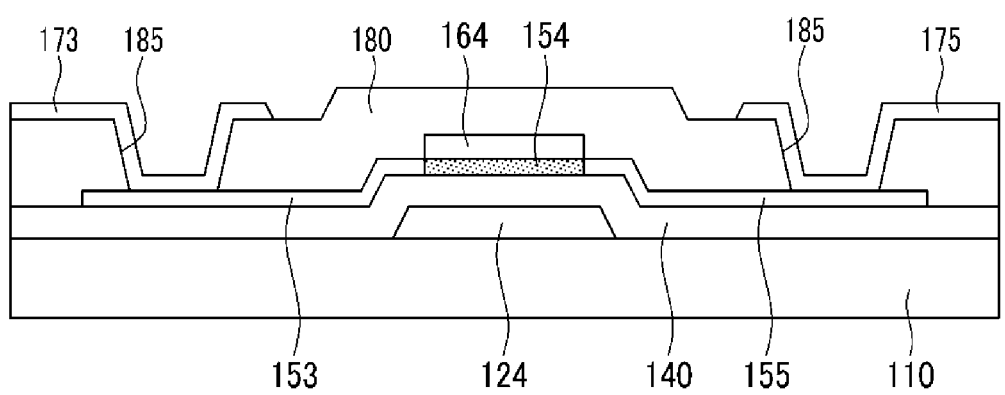
FIG. 12 is a cross-sectional view of a thin film transistor array panel according to exemplary embodiments of the present invention.

Referring to FIG. 12, the thin film transistor and the thin film transistor array panel according to an exemplary embodiment of the present invention will be described.

FIG. 12 is a cross-sectional view of a thin film transistor array panel according to exemplary embodiments of the present invention.

Referring to FIG. 12, the present exemplary embodiment is the same as most of the thin film transistor array panel according to the exemplary embodiment shown in FIG. 4A and FIG. 4B, however portions of the source electrode 173 and the drain electrode 175 may not directly contact the source region 153 and the drain region 155 and may be positioned on the passivation layer 180. In this example, the passivation layer 180 has a contact hole 183 exposing the source region 153 and a contact hole 185 exposing the drain region 155, and the source electrode 173 and the drain electrode 175 may be respectively electrically connected to the source region 153 and the drain region 155 through the contact holes 183 and 185 of the passivation layer 180.

FIG. 13 is a cross-sectional view (a) and a top plane view (b) of a thin film transistor array panel according to exemplary embodiments of the present invention.

Referring to FIG. 13 (a), a light blocking film 70 may be positioned on an insulation substrate 110. The light blocking film 70 prevents light from reaching an oxide semiconductor to be deposited later such that a characteristic of the oxide semiconductor as a semiconductor may be prevented from being lost. Accordingly, the light blocking film 70 is made of a material that does not transmit light of a wavelength band that is not to reach the oxide semiconductor. The light blocking film 70 may be made of an organic insulating material, an inorganic insulating material, or a conductive material such as a metal, and may be formed with a single layer or multiple layers. However, the light blocking film 70 may be omitted by way of a configuration. For example, when the light is not irradiated under the insulation substrate 110, for example when the thin film transistor is used for an organic light emitting device, the light blocking film 70 may be omitted.

A buffer layer 120 may be positioned on the light blocking film 70. The buffer layer 120 may include an insulating oxide such as silicon oxide ($SiO_x$), aluminum oxide ($Al_2O_3$), hafnium oxide ($HfO_3$), and yttrium oxide ($Y_2O_3$). The buffer layer 120 prevents an impurity from the insulation substrate 110 from flowing into the semiconductor to be deposited later, thereby protecting the semiconductor and improving an interface characteristic of the semiconductor.

A semiconductor layer including the channel region 154, the source region 153, and the drain region 155 is positioned on the buffer layer 120. When the light blocking film 70 exists, the channel region 154 may be covered by the light blocking film 70. The description of the channel region 154, the source region 153, and the drain region 155 is the same as that of the above exemplary embodiments such that the detailed description is omitted.

Particularly, the source region 153 and the drain region 155 include the same material as the oxide semiconductor forming the channel region 154, however the carrier concentration of the source region 153 and the drain region 155 is different from the carrier concentration of the channel region 154. For example, when the carrier concentration of the channel region 154 is less than about $10^{18}$ units/cm$^3$, the carrier concentration of the source region 153 and the drain region 155 is equal to or more than about $10^{18}$ units/cm$^3$. The gradient of the carrier concentration is formed in the boundary between the source region 153 or the drain region 155 and the channel region 154.

According to exemplary embodiments of the present invention, the source region 153 and the drain region 155 may include the oxide semiconductor and may be doped with at least one of fluorine (F), hydrogen (H), and sulfur (S). In this example, a concentration of at least one of fluorine (F), hydrogen (H), and sulfur (S) included in the source region 153 and the drain region 155 is equal to or more than about $10^{15}$ units/cm$^3$. The gradient of at least one concentration of fluorine (F), hydrogen (H), and sulfur (S) is formed in the boundary between the source region 153 or the drain region 155 and the channel region 154.

A gate insulating layer 142 is positioned on the channel region 154. The gate insulating layer 142 may cover the channel region 154. Also, the gate insulating layer 142 may not substantially overlap the source region 153 or the drain region 155 by way of configurations.

The gate insulating layer 142 may be formed as a singular layer or a multilayer of at least two layers. When the gate insulating layer 142 is the singular layer, the insulating layer 142 may include the insulating oxide such as silicon oxide ($SiO_x$), aluminum oxide ($Al_2O_3$), hafnium oxide ($HfO_3$), and yttrium oxide ($Y_2O_3$). The insulating layer 142 may improve an interface characteristic of the channel region 154, and may prevent the impurity from penetrating into the channel region 154.

When the gate insulating layer 142 is the multilayer, the gate insulating layer 142 may include a lower layer 142a and an upper layer 142b shown in FIG. 13 (a). The lower layer 142a includes the insulating oxide such as silicon oxide ($SiO_x$), aluminum oxide ($Al_2O_3$), hafnium oxide ($HfO_3$), and yttrium oxide ($Y_2O_3$) such that the interface characteristic of the semiconductor 154 may be improved and the penetration of the impurity into the semiconductor 154 may be prevented. The upper layer 142b may be made of various insulating materials such as silicon nitride ($SiN_x$) and silicon oxide ($SiO_x$).

A gate electrode 124 is positioned on the gate insulating layer 142. An edge boundary of the gate electrode 124 and the edge boundary of the gate insulating layer 142 are arranged to substantially aligned.

Referring to FIG. 13 (a) and FIG. 13 (b), the gate electrode 124 includes a portion overlapping the channel region 154, and the channel region 154 is covered by the gate electrode 124. The source region 153 and the drain region 155 are positioned at both sides of the channel region 154 with respect to the gate electrode 124, and the source region 153 and the drain region 155 may not substantially overlap the gate electrode 124. Accordingly, the parasitic capacitance between the gate electrode 124 and the source region 153 or the parasitic capacitance between the gate electrode 124 and the drain region 155 may be decreased.

According to exemplary embodiments of the present invention, the boundary between the channel region 154 and the source region 153 or the boundary between the channel region 154 and the drain region 155 may substantially be aligned with the edge boundary of the gate electrode 124 and the gate insulating layer 142. However, the boundary between the channel region 154 and the source region 153 or the drain region 155 may be positioned slightly more inward than the edge boundary of the gate electrode 124 and the gate insulating layer 142.

The gate electrode 124, the source region 153, and the drain region 155 form the thin film transistor along with the channel region 154, and the channel of the thin film transistor is formed in the channel region 154.

A passivation layer 180 is positioned on the gate electrode 124, the source region 153, the drain region 155, and the buffer layer 120. The passivation layer 180 may include the contact hole 183 exposing the source region 153 and the contact hole 185 exposing the drain region 155.

The source electrode 173 and the drain electrode 175 may be positioned on the passivation layer 180. The source electrode 173 is electrically connected to the source region 153 of the thin film transistor through the contact hole 183 of the passivation layer 180, and the drain electrode 175 is electrically connected to the drain region 155 of the thin film transistor through the contact hole 185 of the passivation layer 180.

Differently from this, for example, a color filter (not shown) or an organic layer (not shown) made of an organic material may be further positioned on the passivation layer 180, and the source electrode 173 and the drain electrode 175 may be further positioned thereon.

Figure 14:
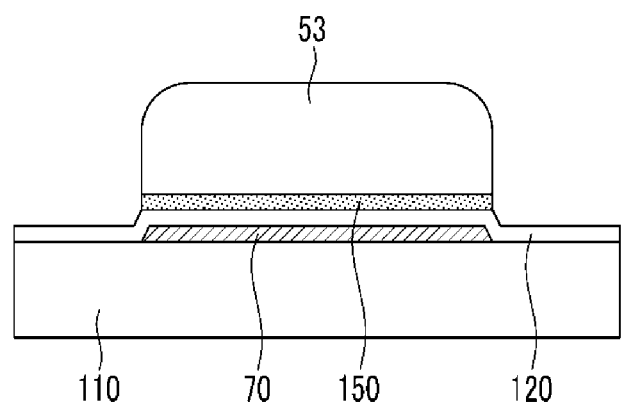
FIG. 14 to FIG. 19 are cross-sectional views showing an exemplary manufacturing process of the thin film transistor array panel shown in FIG. 13 according to exemplary embodiments of the present invention.

FIG. 14 to FIG. 19 are cross-sectional views sequentially showing a manufacturing method of the thin film transistor array panel shown in FIG. 13 according to exemplary embodiments of the present invention, Referring to FIG. 14, the light blocking film 70 made of the organic insulating material, the inorganic insulating material, or the conductive material such as the metal is formed on the insulation substrate 110 made of glass or plastic. The forming of the light blocking film 70 may be omitted by way of configurations.

Referring to FIG. 3, the buffer layer 120 made of the insulating material including the oxide such as silicon oxide ($SiO_X$), aluminum oxide ($Al_2O_3$), hafnium oxide ($HfO_3$), and yttrium oxide ($Y_2O_3$) is formed on the light blocking film 70 by a chemical vapor deposition (CVD) method. A thickness of the buffer layer 120 is in a range from about 500 Å to about 1 μm, but is not limited thereto.

The semiconductor layer made of the oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO) is coated on the buffer layer 120, and then a photosensitive film such as a photoresist is coated thereon. Next, the photosensitive film is exposed to form a photosensitive film pattern 53. The photosensitive film pattern 53 may overlap at least a portion of the light blocking film 70.

The semiconductor layer is etched by using the photosensitive film pattern 53 as a mask to form a semiconductor pattern 150.

Figure 15:
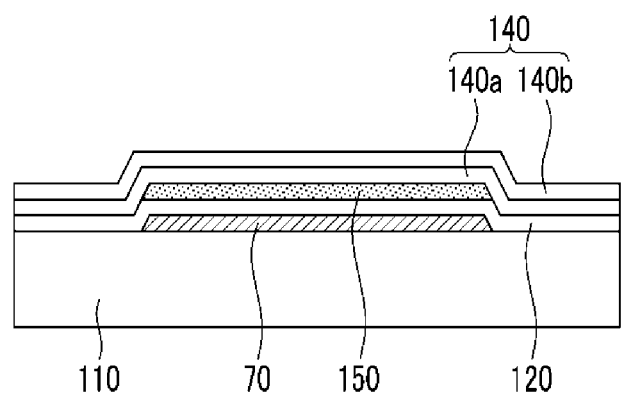

As shown in FIG. 15, a gate insulating layer 140 is formed on the semiconductor pattern 150 and the buffer layer 120. The gate insulating layer 140 may be formed with the singular layer including the insulating oxide of silicon oxide ($SiO_X$), or as shown in FIG. 5, may be formed with the multilayer including a lower layer 140a including the insulating oxide such as silicon oxide ($SiO_X$) and an upper layer 140b including the insulating material. The thickness of the gate insulating layer 140 may be in a range from about 1000 Å to about 5000 Å, but is not limited thereto.

Figure 16:
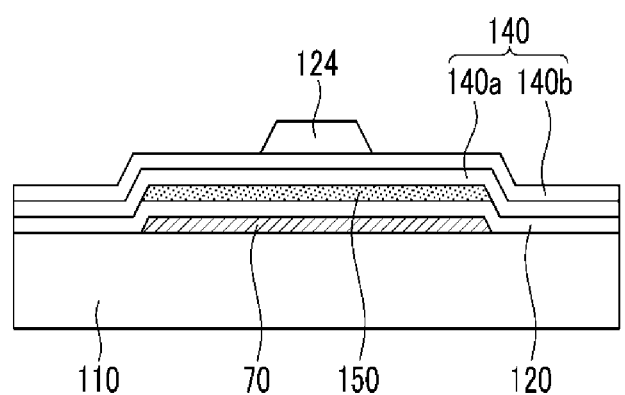

Referring to FIG. 16, a conductive material such as the metal is deposited on the gate insulating layer 140 and is patterned to form the gate electrode 124. The gate electrode 124 is formed to traverse the center portion of the semiconductor pattern 150 such that two portions of the semiconductor pattern 150 positioned on both sides of the overlapping portion of the gate electrode 124 and the semiconductor pattern 150 are not covered by the gate electrode 124.

Figure 17:
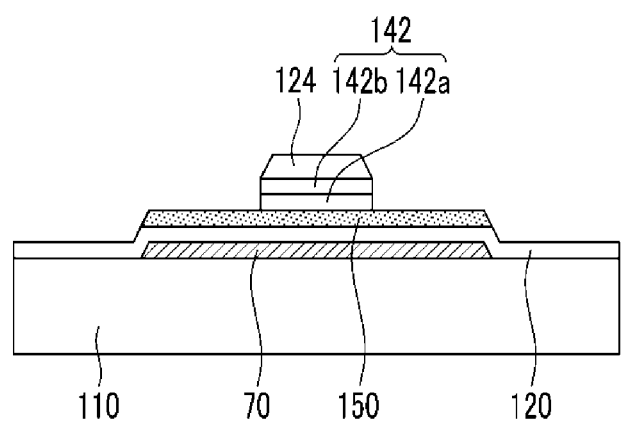

Referring to FIG. 17, the gate insulating layer 140 is patterned by using the gate electrode 124 as an etching mask to form the gate insulating layer 142. The gate insulating layer 142 may be made of the singular layer, or includes the lower layer 142a including the insulating oxide and the upper layer 142b including the insulating material.

Accordingly, the gate electrode 124 and the insulating layer 142 may have substantially the same plane shape. Also, the two portions of the semiconductor pattern 150 that are not covered by the gate electrode 124 are exposed.

Figure 18:
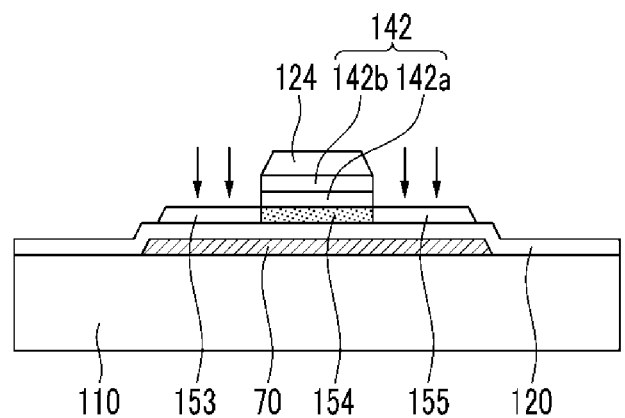

Referring to FIG. 18, the two exposed portion of the semiconductor pattern 150 are processed thereby forming the source region 153 and the drain region 155 having conductivity. The treatment method of the semiconductor pattern 150 is the same as that of the above exemplary embodiments such that the detailed description is omitted.

Particularly, according to exemplary embodiments of the present invention, the method of doping or reducing the exposed semiconductor pattern 150 with at least one of fluorine (F), hydrogen (H), and sulfur (S) by using the gas including at least one of tetrafluoromethane ($CF_4$), nitrogen trifluoride ($NF_3$), sulfur hexafluoride ($SF_6$), and methane ($CH_4$) is used. At least one concentration of fluorine (F), hydrogen (H), and sulfur (S) doped to the source region 153 and the drain region 155 may be equal to or more than about $10^{15}$ units/cm$^3$, and the gradient of at least one concentration of fluorine (F), hydrogen (H), and sulfur (S) may be formed in the boundary between the source region 153 or the drain region 155 and the channel region 154.

Also, the semiconductor pattern 150 that is covered by the insulating layer 142 and is not reduced becomes the channel region 154. Accordingly, the gate electrode 124, the source region 153, and the drain region 155 form the thin film transistor along with the channel region 154.

Figure 19:
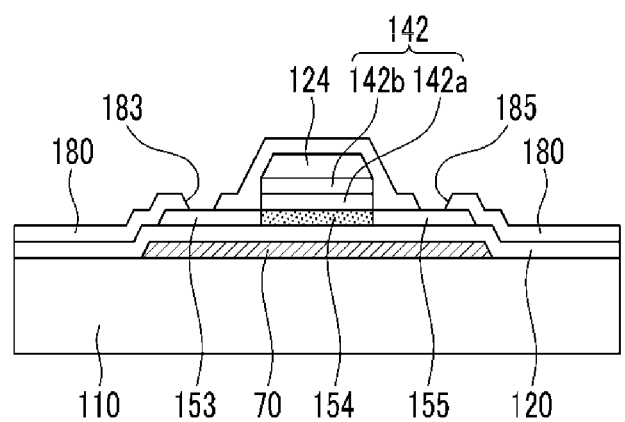

Referring to FIG. 19, the insulating material is coated on the gate electrode 124, the source region 153, the drain region 155, and the buffer layer 120 to form the passivation layer 180. Next, the passivation layer 180 is patterned to form a contact hole 183 exposing the source region 153 and a contact hole 185 exposing the drain region 155.

Finally, as shown in FIG. 13, the source electrode 173 and the drain electrode 175 may be formed on the passivation layer 180.

In the thin film transistor according to exemplary embodiments of the present invention, the source region 153 and the drain region 155 do not substantially overlap the gate electrode 124 such that the parasitic capacitance between the gate electrode 124 and the source region 153 or the drain region 155 may be remarkably reduced. Accordingly, the on/off characteristic as the switching element of the thin film transistor may be improved.

Figure 20:
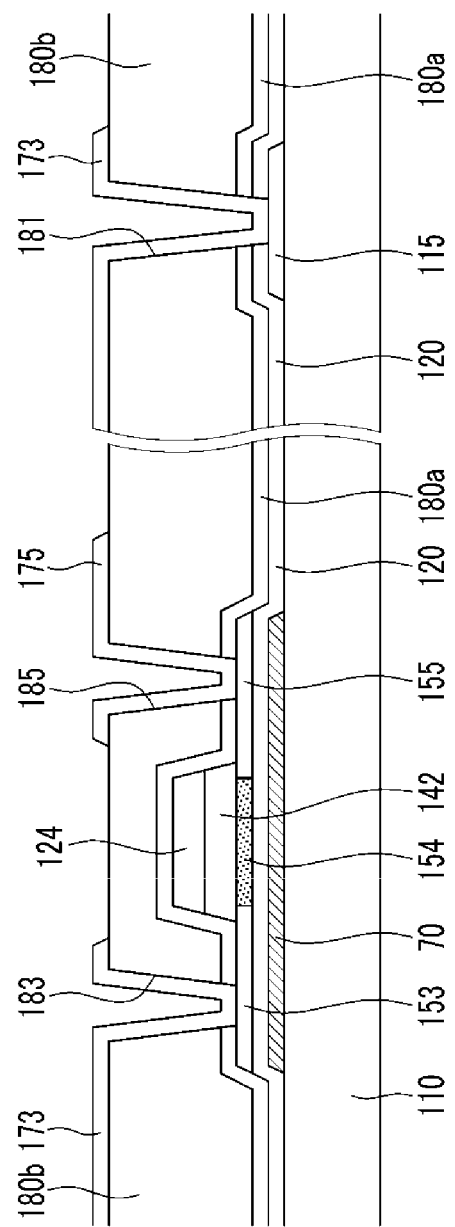
FIG. 20 is a cross-sectional view of a thin film transistor array panel according to exemplary embodiments of the present invention.

FIG. 20 is a cross-sectional view of a thin film transistor array panel according to exemplary embodiments of the present invention.

Referring to FIG. 20, a light blocking film 70 and a data line 115 transmitting a data signal may be positioned on the insulation substrate 110. The data line 115 may be made of the conductive material of the metal such as aluminum (Al), silver (Ag), copper (Cu), molybdenum (Mo), chromium (Cr), tantalum (Ta), and titanium (Ti), or alloys thereof.

A buffer layer 120 is positioned on the light blocking film 70 and the data line 115, and a channel region 154, a source region 153, and a drain region 155 are positioned thereon.

The semiconductor 154 may include the oxide semiconductor material. When the light blocking film 70 exists, the semiconductor 154 may be covered by the light blocking film 70.

The source region 153 and the drain region 155 are positioned at both sides with respect to the channel region 154 to face each other, and are separated from each other. Also, the source region 153 and the drain region 155 are connected to the channel region 154. The description for the channel region 154, the source region 153, and the drain region 155 of the above-described exemplary embodiments may be equally applied to the present exemplary embodiments.

A gate insulating layer 142 is positioned on the channel region 154. The gate insulating layer 142 may cover the channel region 154. Also, the gate insulating layer 142 may almost not overlap the source region 153 or the drain region 155.

A gate electrode 124 is positioned on the gate insulating layer 142. The edge boundary of the gate electrode 124 and the edge boundary of the gate insulating layer 142 may be arranged to substantially be aligned.

The gate electrode 124 includes a portion overlapping the channel region 154, and the channel region 154 is covered by the gate electrode 124. The source region 153 and the drain region 155 are positioned at both sides of the channel region 154 with respect to the gate electrode 124, and the source region 153 and the drain region 155 may not substantially overlap the gate electrode 124. Accordingly, the parasitic capacitance between the gate electrode 124 and the source region 153 or the parasitic capacitance between the gate electrode 124 and the drain region 155 may be substantially decreased.

A passivation layer 180a is positioned on the gate electrode 124, the source region 153, the drain region 155, and the buffer layer 120, and an organic layer 180b may be further positioned thereon.

The organic layer 180b may include an organic insulating material or a color filter material. The surface of the organic layer 180b may be flat.

The passivation layer 180a and the organic layer 180b have the contact hole 183 exposing the source region 153 and the contact hole 185 exposing the drain region 155. Also, the buffer layer 120, the passivation layer 180a, and the organic layer 180b may have a contact hole 181 exposing the data line 115.

The source electrode 173 and the drain electrode 175 may be positioned on the organic layer 180b. The source electrode 173 may be electrically connected to the source region 153 through the contact hole 183, and the drain electrode 175 may be electrically connected to the drain region 155 through the contact hole 185. Also, the source electrode 173 may be connected to the data line 115 through the contact hole 181. Accordingly, the source electrode 173 may receive the data signal from the data line 115. Meanwhile, the drain electrode 175 may form a pixel electrode thereby controlling image display, or it may be connected to an additional pixel electrode (not shown).

Next, a manufacturing method of the thin film transistor array panel shown in FIG. 20 according to an exemplary embodiment of the present invention will be described with reference to FIG. 21 to referring to FIG. 28 as well as FIG. 20.

FIG. 21 to FIG. 28 are cross-sectional views sequentially showing a manufacturing method of the thin film transistor array panel shown in FIG. 20 according to an exemplary embodiment of the present invention.

Figure 21:
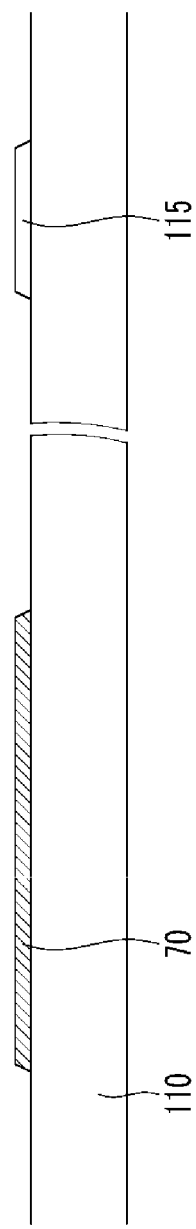
FIG. 21 to FIG. 28 are cross-sectional views sequentially showing an exemplary manufacturing process of the thin film transistor array panel shown in FIG. 20 according to exemplary embodiments of the present invention.

Firstly, referring to FIG. 21, a light blocking film 70 made of the organic insulating material, the inorganic insulating material, or the conductive material such as the metal is formed on an insulation substrate 110. The formation of the light blocking film 70 may be omitted by way of configurations.

The metal is deposited and patterned on the insulation substrate 110 to form a data line 115. The formation sequence of the light blocking film 70 and the data line 115 may be exchanged.

Figure 22:
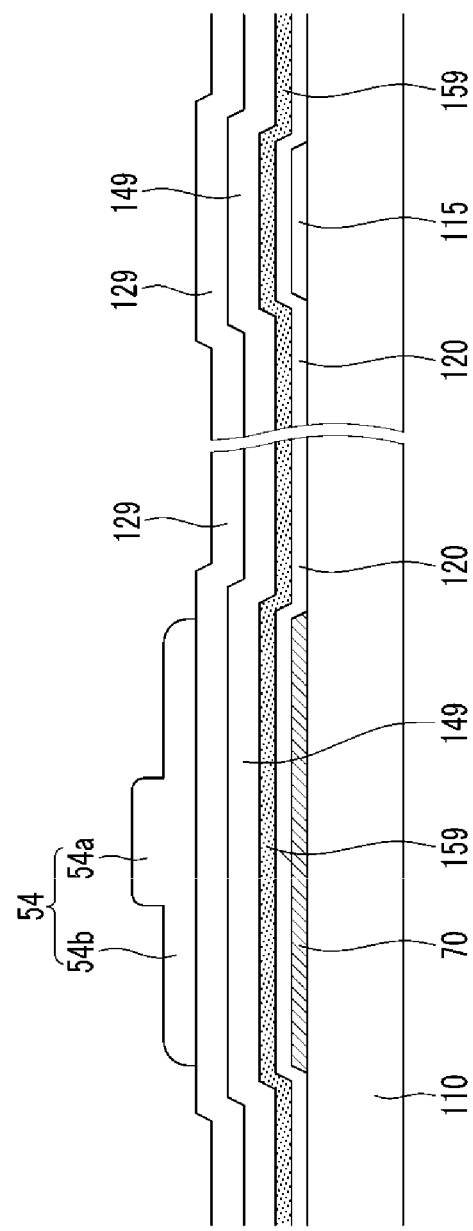

Referring to FIG. 22, a buffer layer 120, a semiconductor material layer 159, an insulating material layer 149, and a gate layer 129 are sequentially deposited on the light blocking film 70 and the data line 115.

The semiconductor material layer 159 may be formed by depositing the oxide semiconductor material such as zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

The insulating material layer 149 may be formed of the insulating material including the insulating oxide such as silicon oxide ($SiO_x$).

The gate layer 129 may be formed by depositing the conductive material such as aluminum (Al).

A photosensitive film of the photoresist is coated on the gate layer 129 and is exposed to form a photosensitive film pattern 54. The photosensitive film pattern 54 includes, as shown in FIG. 22, a first portion 54a having a relatively thin thickness and a second portion 54b having a relatively thick thickness. The first portion 54a of the photosensitive film pattern 54 may be positioned at the portion overlapping the light blocking film 70. Also, a pair of second portions 54b that are separated and face each other with respect to the first portion 54a are connected to both sides of the first portion 54a of the photosensitive film pattern 54.

The photosensitive film pattern 54 may be formed by exposing through a photomask (not shown) including a transflective region. For example, the photomask for forming the photosensitive film pattern 54 may include a transmission region transmitting light, a light blocking region where light is not transmitted, and a transflective region where light is partially transmitted. The transflective region may be formed by using a slit or a translucent layer.

If the exposure is performed by the photomask including the transflective region, in a case of using a negative photosensitive film, the portion corresponding to the transmission region of the photomask is irradiated with the light such that the photosensitive film remains thereby forming the first portion 54a having a thick thickness, the portion corresponding to the light blocking region of the photomask is not irradiated with the light such that the photosensitive film is removed, and the portion corresponding to the transflective region of the photomask is partially irradiated with the light such that the second portion 54b having a relatively thin thickness is formed. In the case of using a positive photosensitive film, the above case is reversed, however the portion corresponding to the transflective region of the photomask is still partially irradiated such that the second portion 54b of the photosensitive film pattern 54 is formed.

Figure 23:
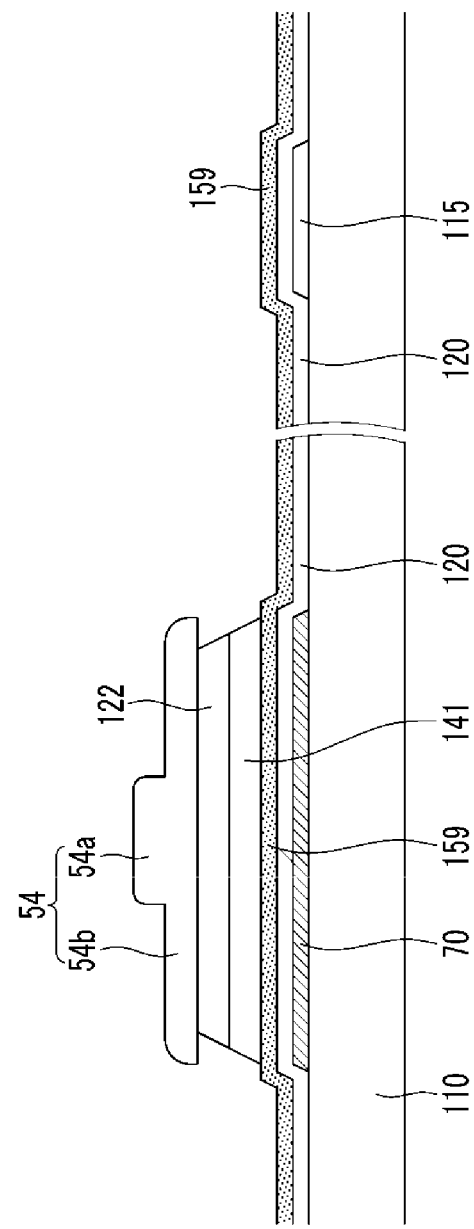

Referring to FIG. 23, the gate layer 129 and the insulating material layer 149 are sequentially etched by using the photosensitive film pattern 54 as the etching mask. For example, the gate layer 129 may be etched through a wet etching method, and the insulating material layer 149 may be etched through a dry etching method. Accordingly, a gate pattern 122 and the insulating pattern 141 having the same plane shape may be formed under the photosensitive film pattern 54. The semiconductor material layer 159 that is not covered by the photosensitive film pattern 54 may be exposed.

Figure 24:
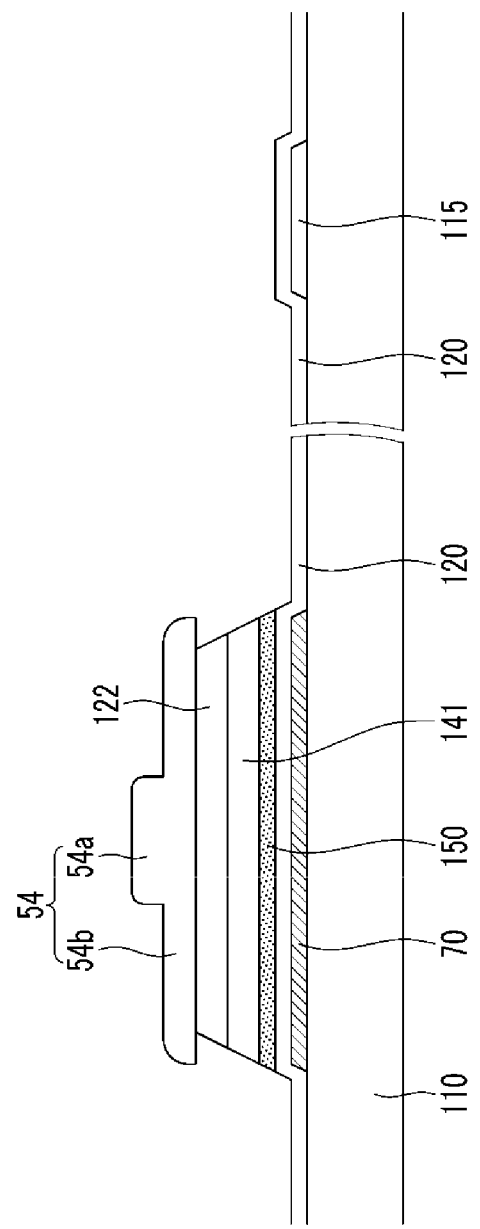

Referring to FIG. 24, the exposed semiconductor material layer 159 is removed by using the gate pattern 122 and the insulating pattern 141 as the etching mask to form a semiconductor pattern 150. The semiconductor pattern 150 may have the same plane shape as the gate pattern 122 and the insulating pattern 141.

Figure 25:
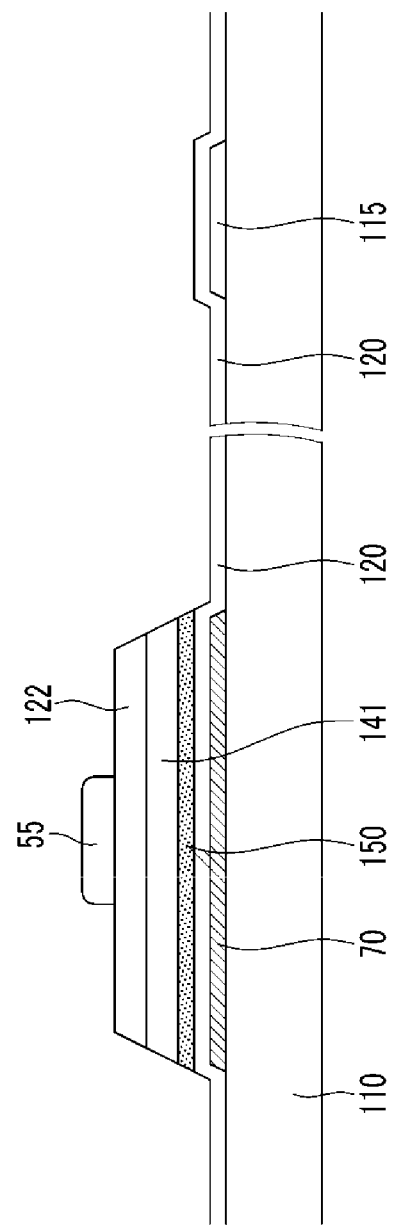

Referring to FIG. 25, the photosensitive film pattern 54 is entirely etched through an ashing method using oxygen plasma to remove the second portion 54b by reducing the thickness. Accordingly, the first portion 54a with the reduced thickness remains thereby forming a photosensitive film pattern 55.

Figure 26:
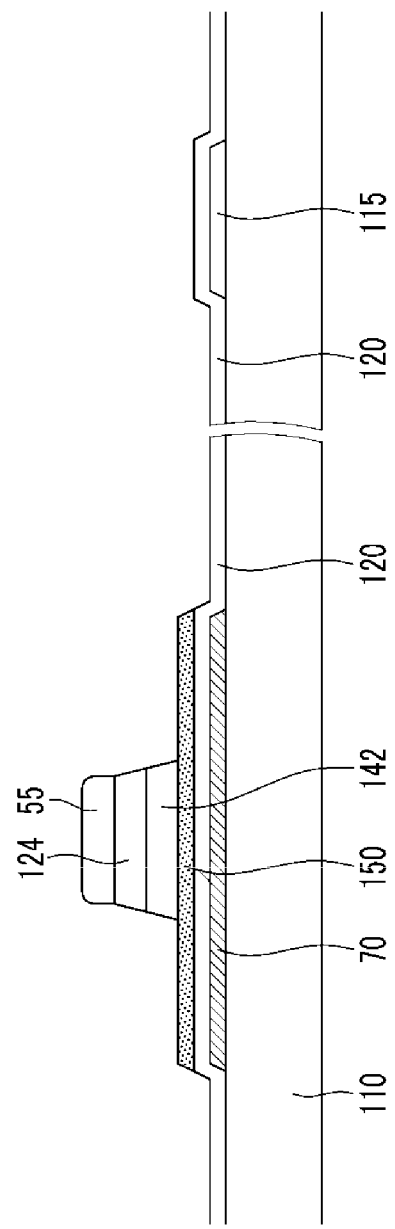

Referring to FIG. 26, the gate pattern 122 and the insulating pattern 141 are sequentially etched by using the photosensitive film pattern 55 as the etching mask. Accordingly, the semiconductor pattern 150 that is not covered by the photosensitive film pattern 55 is exposed and a gate electrode 124 and a gate insulating layer 142 are formed. The exposed semiconductor pattern 150 is positioned at both sides with respect to the semiconductor pattern 150 that is covered by the photosensitive film pattern 55.

Figure 27:
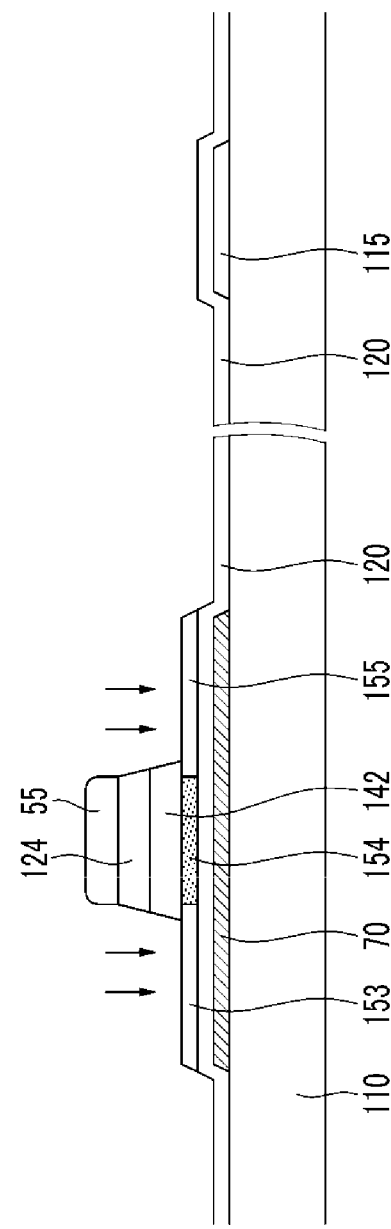

Referring to FIG. 27, the semiconductor pattern 150 undergoes a reduction treatment to form the source region 153 and the drain region 155 having conductivity. The reduction treatment is the same as that of the above exemplary embodiments such that the detailed description is omitted.

Also, the semiconductor pattern 150 that is covered by the gate insulating layer 142 is not reduced thereby forming the channel region 154. The gate electrode 124, the source region 153, and the drain region 155 form the thin film transistor along with the channel region 154.

Figure 28:
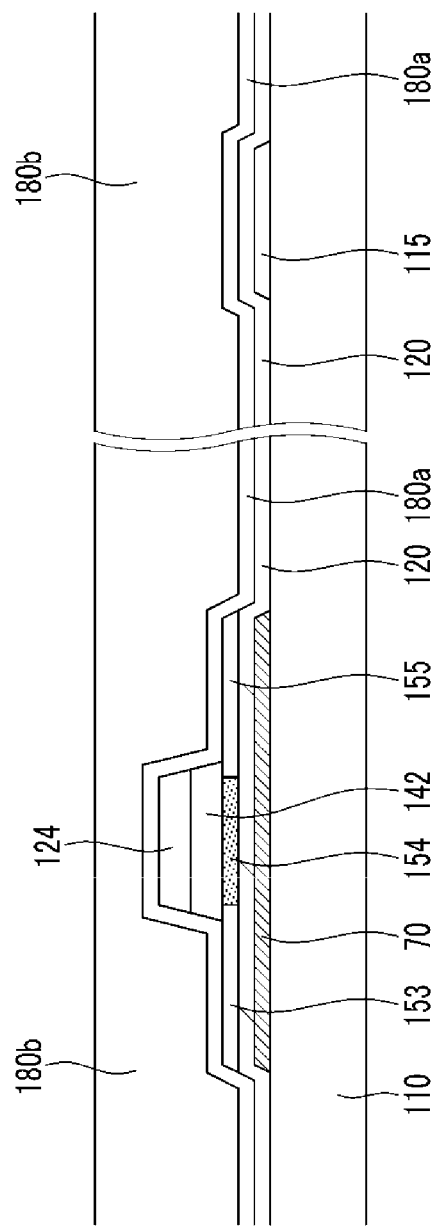

Referring to FIG. 28, after removing the photosensitive film pattern 55, the insulating material is coated on the gate electrode 124, the source region 153, the drain region 155, and the buffer layer 120 to form a passivation layer 180*a*. The organic insulating material may be coated on the passivation layer 180*a* to additionally form the organic layer 180*b*.

As shown in FIG. 20, the passivation layer 180*a* and the organic layer 180*b* may be patterned to form the contact holes 183, 185, and 181, and then the source electrode 173 and the drain electrode 175 may be formed on the organic layer 180*b*.

As described above, according to exemplary embodiments of the present invention, the gate electrode 124 and the source region 153 or the drain region 155 of the thin film transistor are almost not overlapped or are slightly overlapped such that the parasitic capacitance between the gate electrode 124 and the source region 153 or the parasitic capacitance between the gate electrode 124 and the drain region 155 may be very small. Accordingly, the on-current and the mobility of the thin film transistor may be increased and the on/off characteristic of the switching element of the thin film transistor may be improved. As a consequence, the RC delay may be decreased in the display device applied with this thin film transistor. Accordingly, the manufacturing cost may be reduced by obtaining a margin when reducing the thickness of the driving signal wire. Also, the characteristic of the thin film transistor itself is excellent such that the size of the thin film transistor may be reduced and a margin for forming a minute channel may be obtained.

Figure 29:
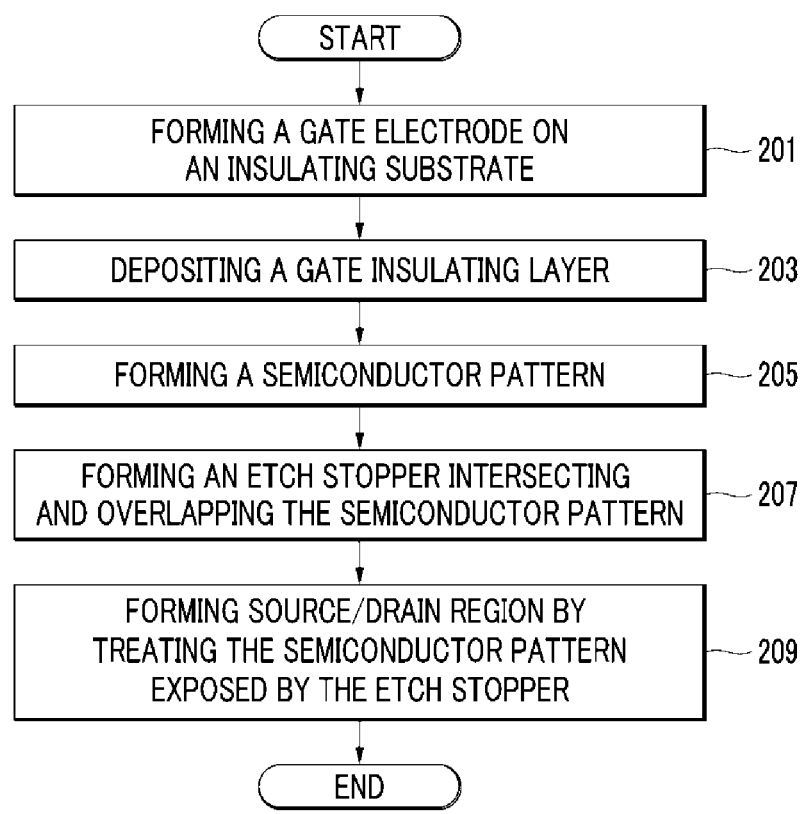

According to exemplary embodiments, FIG. 29 is a flowchart of a process for manufacturing a thin film transistor array panel. In step 201, a gate electrode is formed on an insulation substrate. In step 203, a gate insulating layer is deposited on the gate electrode. A semiconductor pattern is formed on the gate insulating layer. (step 205) In step 207, an etch stopper is formed on the semiconductor pattern on the semiconductor pattern. In step 209, a source region and a drain region are formed by treating the portions of the semiconductor pattern that are exposed by the etch stopper, thereby forming a channel region. A carrier concentration of the source region and the drain region is larger than a carrier concentration of the channel region.

According to exemplary embodiments, FIG. 30 is a flowchart of a process for manufacturing a thin film transistor array panel. In step 301, a semiconductor pattern comprising an oxide semiconductor is formed on an insulation substrate. In step 303, an insulating material is deposited on the semiconductor pattern to form an insulating material layer. Per step 305, a gate electrode is formed on the insulating material layer. In step 307, the insulating material layer is patterned by using the gate electrode as an etching mask to form a gate insulating layer and to expose a portion of the semiconductor pattern. In step 309, the exposed semiconductor pattern is treated to form a channel region covered by the gate electrode, and to form a source region and a drain region facing each other with respect to the channel region, wherein a carrier concentration of the source region and the drain region is larger than a carrier concentration of the channel region.

The above processes, when applied in manufacturing processes for making a display panel capable of providing excellent switching element by improving current mobility of thin film transistor. In addition, these processes can solve RC delays of the thin film transistor.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor array panel, the method comprising:
    forming a gate line comprising a gate electrode on an insulation substrate;
    forming a gate insulating layer on the gate electrode;
    forming a semiconductor pattern on the gate insulating layer;
    forming a linear etch stopper comprising an etch stopper on the semiconductor pattern, the etch stopper intersecting and overlapping the semiconductor pattern;
    treating an exposed portion of the semiconductor pattern, thereby forming a source region and a drain region in the exposed portion of the semiconductor pattern; and
    forming a data line crossing the gate line,
    wherein a carrier concentration of the source region and the drain region is larger than carrier concentration of a channel region, the channel region being a portion of the semiconductor pattern covered by the etch stopper, and
    wherein the linear etch stopper extends substantially parallel to the gate line, overlaps the gate line, and crosses the data line in a plan view.

2. The method of claim 1, wherein
    treating the semiconductor pattern comprises reducing the semiconductor pattern.

3. The method of claim 1, wherein
    forming the etch stopper comprises:
    depositing an inorganic material or an organic material on the semiconductor pattern to form an etch stopper layer;
    coating a photosensitive film on the etch stopper layer and irradiating light from a rear side of the insulation substrate to form a photosensitive film pattern overlapping the gate electrode; and
    etching the etch stopper layer by using the photosensitive film pattern as a mask to form the etch stopper.

4. The method of claim 1, wherein
    the treating of the semiconductor pattern includes doping the semiconductor pattern with at least one of fluorine (F), hydrogen (H), and sulfur (S) by using a gas including at least one of tetrafluoromethane ($CF_4$), nitrogen trifluoride ($NF_3$), sulfur hexafluoride ($SF_6$), and methane ($CH_4$).

5. The method of claim 1, wherein the carrier concentration of the channel region is less than about $10^{18}$ units/cm$^3$, and the carrier concentration of the source region and the drain region is equal to or more than about $10^{18}$ units/cm$^3$.

6. The method of claim 1, further comprising:
depositing a passivation layer on the channel region, the source region, and the drain region, and
forming an upper gate electrode overlapping the channel region on the passivation layer.

7. The method of claim 1, wherein forming the etch stopper comprises
depositing an inorganic material or an organic material on the semiconductor pattern to form an etch stopper layer,
coating a photosensitive film on the etch stopper layer and irradiating light from a rear side of the insulation substrate to form a photosensitive film pattern overlapping the gate electrode, and
etching the etch stopper layer by using the photosensitive film pattern as a mask to form the etch stopper.

8. The method of claim 2, wherein
treating the semiconductor pattern comprises doping the semiconductor pattern with at least one of fluorine (F), hydrogen (H), and sulfur (S) by using a gas including at least one of tetrafluoromethane ($CF_4$), nitrogen trifluoride ($NF_3$), sulfur hexafluoride ($SF_6$), and methane ($CH_4$).

9. The method of claim 3, wherein
the photosensitive film has positive photosensitivity.

10. The method of claim 4, wherein
a concentration of at least one of fluorine (F), hydrogen (H), and sulfur (S) included in the source region and the drain region is equal to or more than about $10^{15}$ units/cm$^3$.

11. The method of claim 7, wherein
the photosensitive film has positive photosensitivity.

12. The method of claim 8, wherein
a concentration of at least one of fluorine (F), hydrogen (H), and sulfur (S) included in the source region and the drain region is equal to or more than about $10^{15}$ units/cm$^3$.

13. The method of claim 12, wherein
the carrier concentration of the channel region is less than about $10^{18}$ units/cm$^3$, and the carrier concentration of the source region and the drain region is equal to or more than about $10^{18}$ units/cm$^3$.

14. The method of claim 13, further comprising:
forming a source electrode and a drain electrode respectively on the source region and the drain region.

15. The method of claim 14, further comprising:
depositing a passivation layer on the channel region, the source region, and the drain region, and
forming an upper gate electrode overlapping the channel region on the passivation layer.

16. A method of manufacturing a thin film transistor array panel, the method comprising:
forming a light blocking pattern on an insulation substrate;
forming a buffer layer on the light blocking pattern and the substrate;
forming a semiconductor pattern comprising an oxide semiconductor on the buffer layer overlapping the light blocking pattern;
depositing an insulating material on the semiconductor pattern to form an insulating material layer;
forming a gate electrode on the insulating material layer;
patterning the insulating material layer by using the gate electrode as an etching mask to form a gate insulating layer and to expose a portion of the semiconductor pattern; and
treating the exposed semiconductor pattern to form a channel region covered by the gate electrode, and to form a source region and a drain region facing each other with respect to the channel region,
wherein a carrier concentration of the source region and the drain region is larger than a carrier concentration of the channel region, wherein
treating the semiconductor pattern includes doping the semiconductor pattern with at least one of fluorine (F), hydrogen (H), and sulfur (S) by using a gas including at least one of tetrafluoromethane ($CF_4$), nitrogen trifluoride ($NF_3$), sulfur hexafluoride ($SF_6$), and methane ($CH_4$).

17. The method of claim 16, wherein
a concentration of at least one of fluorine (F), hydrogen (H), and sulfur (S) included in the source region and the drain region is equal to or more than about $10^{15}$ units/cm$^3$.

* * * * *